US006869480B1

(12) United States Patent
Abel et al.

(10) Patent No.: US 6,869,480 B1
(45) Date of Patent: Mar. 22, 2005

(54) METHOD FOR THE PRODUCTION OF NANOMETER SCALE STEP HEIGHT REFERENCE SPECIMENS

(75) Inventors: Phillip B. Abel, Cleveland, OH (US); J. Anthony Powell, North Olmsted, OH (US); Philip G. Neudeck, Olmsted Falls, OH (US)

(73) Assignee: The United States of America as represented by the United States National Aeronautics and Space Administration, Washington, DC (US)

( * ) Notice: Subject to any disclaimer, the term of this patent is extended or adjusted under 35 U.S.C. 154(b) by 288 days.

(21) Appl. No.: 10/198,668

(22) Filed: Jul. 17, 2002

(51) Int. Cl.[7] ............................................. C30B 25/18
(52) U.S. Cl. ............................. 117/89; 117/90; 117/93; 117/94; 117/95; 117/101
(58) Field of Search ............................... 117/89, 90, 93, 117/94, 95, 101

(56) References Cited

U.S. PATENT DOCUMENTS

| | | | |
|---|---|---|---|
| 5,599,464 A | | 2/1997 | Laird |
| 5,915,194 A | * | 6/1999 | Powell et al. ............... 438/478 |
| 5,955,654 A | | 9/1999 | Stover |
| 5,960,255 A | | 9/1999 | Bartha |
| 5,976,936 A | * | 11/1999 | Miyajima et al. ........... 438/268 |
| 6,028,008 A | | 2/2000 | Bayer |
| 6,165,874 A | * | 12/2000 | Powell et al. ............... 438/478 |
| 6,461,944 B2 | * | 10/2002 | Neudeck et al. ............ 438/478 |
| 6,488,771 B1 | * | 12/2002 | Powell et al. .................. 117/89 |

OTHER PUBLICATIONS

M. Suzuki, "Standardized Procedure for Calibrating Height Scales in Atomic Force Microscopy on the Order of 1 nm"; Journal of Vacuum Science & Technology A, vol. 14, No. 3, pp 1228–1232 (1996).
Commercially Available Product Descriptions.

* cited by examiner

Primary Examiner—Robert Kunemund
(74) Attorney, Agent, or Firm—Kent N. Stone; John P. McMahon

(57) ABSTRACT

Methods are disclosed that provide for structures and techniques for the fabrication of ordered arrangements of crystallographically determined nanometer scale steps on single crystal substrates, particularly SiC. The ordered nanometer scale step structures are produced on the top surfaces of mesas by a combination of growth and etching processes. These structures, sometimes referred to herein as artifacts, are to enable step-height calibration, particularly suitable for scanning probe microscopes and profilometers, from less than one nanometer (nm) to greater than 10 nm, with substantially no atomic scale roughness of the plateaus on either side of each step.

75 Claims, 12 Drawing Sheets

US 6,869,480 B1

METHOD FOR THE PRODUCTION OF NANOMETER SCALE STEP HEIGHT REFERENCE SPECIMENS

ORIGIN OF THE INVENTION

The invention described herein was made by employees of the United States Government and may be used by or for the Government for governmental purposes without payment of any royalties thereon or therefor.

FIELD OF THE INVENTION

The invention relates to methods, which provide for structures and techniques for the fabrication of ordered arrangements of atomic scale steps on SiC single crystal substrates. The structures consist of patterned arrays of mesas with each mesa having a pattern of steps etched and/or grown on a selected crystal plane. These structures with steps perform as physical artifacts that are particularly suited for scanning probe microscopes and profilometers to enable step-height calibration from less than one nanometer (nm) to greater than 10 nm, with no more than atomic scale roughness of the plateaus of the structures thereof on either side of each step.

BACKGROUND OF THE INVENTION

The current generation of commercially available scanning probe microscopes and profilometers routinely generate sub-nanometer precision height readings as a function of the lateral position on solid surfaces. Calibration methods used for devices, such as scanning probe microscopes, are known in the art and some of which are disclosed in U.S. Pat. Nos. 5,599,464; 5,955,654; and 5,960,255, all of which are herein incorporated by reference.

While the level of quantitative two or three-dimensional topographic information related to scanning probe microscopes may be critical to modern manufacturing quality control or to leading-edge research, the ideal step-height calibration artifact (herein also called a device) for measurement confidence from multiple nanometers down to the one nanometer level and below has not, from our understanding, previously been commercially available.

Step-height calibration artifacts have miniature size dimensions that are similar to microcircuit chips yielded by the semiconductor art. Some of these, including this invention, are related to the controlled growth of crystalline surfaces and crystal films.

Silicon carbide crystals exist in hexagonal, rhombohedral and cubic crystal structures. Generally, the cubic structure, with the zincblende structure, is referred to as βM-SiC or 3C-SiC, whereas numerous polytypes of the hexagonal and rhombohedral structures are collectively referred to as α-SiC. To our knowledge, only bulk (i.e., large) crystals of the α polytypes have been grown to date: the β (or 3C) polytype can only be obtained as small (less than 1 $cm^2$ in area) blocky crystals or thick epitaxial films on small 3C substrates or crystal films grown heteroepitaxially on some other substrate. The most commonly available α-Sic polytypes are 4H-SiC and 6H-SiC; these are commercially available as polished wafers, presently up to 75 mm in diameter.

Silicon carbide polytypes are formed by the stacking of double layers of Si and C atoms. Each double layer may be situated in one of three positions known as A, B, and C. The sequence of stacking determines the particular polytype; for example, the repeat sequence for 3C is: ABCABC ... (or ACBACB ...) the repeat sequence for 4H is ABACABAC, and the repeat sequence for 6H is ABCACBABCACB. From this it can be seen that the number in the polytype designation gives the number of double layers in the repeat sequence and the letter denotes the structure type (cubic, hexagonal, or rhombohedral). The stacking direction is designated as the crystal c-axis and is in the crystal <0001> direction; it is perpendicular to the basal plane, which is the crystal (0001) plane. The (111) planes of the cubic structure are equivalent to the (0001) plane of the α polytypes. The SiC polytypes are polar in the <0001> directions; in one direction, the crystal face is terminated with silicon (Si) atoms; in the other direction, the crystal face is terminated with carbon (C) atoms. These two faces of the (0001) plane are known as the Si-face and C-face, respectively. As used herein, "basal plane" shall refer to either the (0001) plane for a α-SiC, or the (111) plane of 3C-SiC. The term "basal plane" shall also refer herein to any (111) plane in any cubic single-crystal material with tetrahedral bonding known in the art. Examples of such material are silicon (Si) and gallium arsenide (GaAs). Further details related to tetrahedral bonding are disclosed in U.S. patent application Ser. No. 09/965,250 now U.S. Pat. No. 6,488,771 issued Dec. 3, 2002 and herein incorporated by reference. The term "vicinal (0001) wafer" is used herein for wafers whose polished surface (the growth surface) is misoriented less than 100 from the basal plane. The angle of misorientation shall be referred to herein as the tilt angle. The term "homoepitaxial" shall be referred to herein as epitaxial growth, whereby the film and the substrate (wafer) are of the same polytype and material, and the term "heteroepitaxial" shall be referred to herein as epitaxial growth whereby the film is of a different polytype or material than the substrate. The term "bilayer" shall be referred to herein as a layer parallel to a basal plane consisting of two tightly bonded monolayers of atoms. Specifically, each atom within a given monolayer of the bilayer has three bonds to atoms in the other monolayer within the same bilayer. The term "mesa" is meant to represent an isolated growth region that extends above the surrounding surface, and has a top planar surface (neglecting atomic-scale steps that may be in the top surface).

Theories explaining epitaxial single-crystal growth are well known. Crystal growth can take place by several mechanisms. Two of these are: (1) growth can take place by the lateral growth of existing atomic-scale steps on the surface of a substrate and (2) growth can take place by the formation of two-dimensional atomic-scale nuclei on the surface followed by lateral growth from the steps formed by the nuclei. The lateral growth from steps is sometimes referred to as "step-flow growth." In the first mechanism, growth proceeds by step-flow from existing steps without the formation of any two-dimensional nuclei (i.e., without 2D nucleation). In the nucleation mechanism, the nucleus must reach a critical size in order to be stable. Contamination or defects on the substrate surface can become nucleation sites. In the processes described in U.S. Pat. Nos. 5,915,194 and 6,165,874, crystal growth proceeds by (1) step flow without 2D nucleation or by (2) step-flow with 2D nucleation. Step-flow growth with 2D nucleation allows the growth of epitaxial films of any desired thickness. The reverse of step-flow growth is the lateral etching of steps on a surface; this is known as step-flow etching. The term "atomically-flat" is known in the art and is generally referred to herein as meaning a surface that is totally without any atomic-scale or macro-scale steps over an area defined by selected boundaries that may be created by trenches in a manner to be further described with reference to FIG. 3. Note that the term does not preclude point defects (e.g. lack of a single atom) within the surface. Further, as used herein, an artifact used as a dimensional reference standard is a physical object which is precisely sized in at least one direction such that the known dimension of the artifact can be used to calibrate measuring instruments.

Ideally, a step height reference standard artifact, produced by semiconductor etching/deposition techniques, or other techniques, would be reproducible and robust in use, dimensionally stable, and durable. For maximum reproducibility and utility near the one nanometer step height level, the defining plateaus associated with steps of the artifact should be parallel and atomically-flat. The step-height reference should also have a well established value, fixed ideally by fundamental material physical properties, rather than by a transfer calibration procedure, which may be difficult at the one nanometer level or may only yield (laterally) averaged step-heights. Naturally occurring single crystal low-index plane individual steps might offer intrepid researchers a calibration artifact. Typically, however, these require careful location and preservation, so generally are considered less desirable as a commercial step-height reference standard than other approaches.

The following is a discussion of terms used to describe steps in the prior art and in the present invention that may be further described with reference to FIG. 1, which is composed of FIGS. 1A, 1B, 1C and 1D. FIG. 1A is a schematic of a common step structure 10 and can be used to define some terms used herein to describe components of steps. Referring to FIG. 1A, the part of a step that is a flat horizontal surface shall be called the terrace or plateau 12. The part of a step that is the vertical surface separating two successive terraces shall be called the riser 14. The minimum vertical distance between two successive terraces shall be called the height 16 of the step. The minimum horizontal distance between two successive risers of a series of steps shall be called the width 18 of the step. The maximum distance along the outside edge formed by the riser and terrace shall be called the length 20 of the step. The top of the riser 14 and the outer edge of the terrace or plateau is shown in FIG. 1A as step edge 22.

The following is a discussion of step structures that are used either in prior art or in the present invention. Referring to FIG. 1, FIG. 1B is a cross-sectional view of a common step structure used in commercial step-height calibration artifacts. Herein, this structure shall be called the square wave step structure 10A. FIG. 1C is a cross-section view of a step structure which, herein shall be called a saw tooth step structure 10B. FIG. 1D is a cross-sectional view of a step structure herein called a pyramidal step structure 10C. For the pyramidal structure, the structure will exhibit the pattern shown in FIG. 1D for two cross-sectional views at right angle angles to each other. Hence, this structure has a maximum height in the middle of the structure.

One current type of step-height standard is fabricated by etching/deposition processes resulting in some undesired roughness, such as the intrinsic surface roughness of a native silicon oxide more fully described, for example, in two (2) U.S. Pat. Nos. 5,955,654; and 5,599,464, as well as in the technical brochure of Silicon MDT Ltd., POB 50,103305, made available in Moscow, Russia and represented by K-TEK International, Inc., of Portland, Oreg. Further, the intrinsic surface roughness of a deposited polycrystalline metal film is found in the product literature of VLSI Standards, Inc., of San Jose, Calif. and MCNC, of Research Triangle Park, North Carolina. This intrinsic surface roughness would make difficult the production of a reference step-height on the same vertical (height) size scale as the surface roughness value of the deposited material. Therefore, commercially available manufactured step-height standards typically offer step heights no smaller than 10 to 20 nm. In other cases, such as in U.S. Pat. Nos. 5,960,255 and 6,028,008, the etching/deposition processes result in films or structures that may or may not be adequately uniform or that have dimensions that may vary with processing parameters, leading to calibration transfer questions to be addressed before relying on these artifacts.

Another type of step-height standard in the form of a physical artifact, currently available, uses etched steps over a large area single crystal (i.e., silicon, or virtually any large area single crystal, including silicon carbide). A problem experienced by such an artifact is that the quality and direction of such steps is dependent on (1) the prior treatment of the surface of the single crystal substrate being used, and (2) the quality of the single crystal substrate itself. If the surface is not properly prepared, the direction of the steps will change with the location on the surface. In the case of an artifact fabricated on a surface of silicon that is slightly off-axis from the (111) crystallographic plane, the step-height is limited to the height of a single bilayer.

Artifacts possessing these features are somewhat described in the technical article of M. Suzuki et al, entitled "Standardized Procedure for Calibrating Height Scales in Atomic Force Microscopy on the order of 1 nm", published in *Journal of Vacuum Science & Technology A*, Vol. 14, No. 3, pp. 1228–1232 (1996).

Artifacts fabricated on a surface of SiC that is slightly off-axis from the crystallographic basal plane have significant advantages over silicon artifacts. Silicon carbide is much harder and much more chemically inert than silicon so SiC artifacts are more durable than silicon artifacts. For example, the surface of silicon is well known to rapidly form a native oxide layer when exposed to air, whereas oxidation rates for SiC are many times smaller. Furthermore, SiC steps greater in height than a single bilayer can be produced.

SiC artifacts have serious problems that are unique to SiC. Commercially available single-crystal SiC substrates contain a high density of defects, such as screw dislocations, that impact the quality, reproducibility and utility of the step pattern. For example, the orderly formation of steps on a SiC surface (slightly off-axis from the basal plane) by a step flow process (either by etching or growth) is often disturbed in the vicinity of defects. This prevents the controlled production of ordered steps uniformly across a SiC surface. Also, the defects can promote a process known as step bunching to occur in an uncontrolled manner to form undesired varying step-heights.

Current commercially available NIST (National Institute of Standards and Technology) traceable step-height reference grid samples extend from above 100 nm in height down to nominally 18 nm. For the smallest currently available NIST traceable step-height standards, a platinum coating is evaporated onto a silicon dioxide or quartz surface that has been processed to contain the desired step pattern. The platinum coating provides conductivity, giving a surface finish which is that of a deposited metal (Pt) film. Because the step height can vary from sample to sample as the deposition or step production process can vary over time, NIST traceability is individually established for each step-height reference artifact. From our understanding, there exists currently no commercially (or generally) available step-height reference useful for SPM calibration covering the range from 10 nm down to about 1 nm, whether NIST traceable or not. One current practice using an evaporated platinum coating introduces an inherent surface roughness, typically on the order of at least 1 nm for nominally 40 nm thick platinum films limiting its usage for an artifact for SPM calibration procedures. Accordingly, it is desired to provide a method that is particularly suited for forming an artifact that may be employed for SPM calibration procedures and has the feature of precisely controlled plateau height variations which, in turn, provides for a controlled pattern of steps of crystallographically determined height for the standard reference artifact. Because such an artifact would be much more accurately and easily reproducible, the need for each artifact to be individually calibrated and traced can be eliminated or greatly simplified.

OBJECTS OF THE INVENTION

It is a primary object of the present invention to provide a method that yields a device particularly suited to serve as an artifact for scanning probe microscopes and profilometers and having precisely controlled plateau height variations which, in turn, provides for a controlled pattern of steps of crystallographically determined heights for the standard reference artifact.

It is another object of the present invention to produce a method that makes nanometer and subnanometer scale step-heights across an artifact possible, and with greater precision than current commercial products, due to the terraces between steps being atomically-flat.

Also, it is an object of the present invention to provide a range of knowable nanometer scale step-heights which can be fabricated adjacent to one another on the same substrate, adjustable in units of the crystallographic bilayer repeat distance, e.g. 0.25 nanometer, for the SiC polytypes, and in units (or half units) of the SiC polytype repeat distance, e.g., 1.0 nanometer (or 0.5 nanometer) for 4H-SiC.

In addition, it is an object to provide a method that forms an artifact that is an inherently more robust silicon carbide (SiC) surface, which is harder and more chemically inert than silicon used for some previous standards. The patterns associated with the artifacts are also more reproducible than previous standards based on crystallographically determined steps.

Furthermore, it is an object to provide a method having maximum precision, so that the plateaus between steps are as smooth as possible, such as is offered by single crystal low-index crystallographic planes implemented in the present invention.

Moreover, it is an object of the present invention to use doped SiC which eliminates the need for an electrically conducting coating; hence, the intrinsic roughness of an evaporated metal film or surface oxide is avoided. The higher electrical conductivity of doped SiC allows use with SPM or electron beam based instruments (e.g., scanning Auger spectrometer) without concern for adherence of a metal overlayer. SiC is stable against a nominal environment, so it can provide a robust surface for SPM calibration measurements.

SUMMARY OF THE INVENTION

The present invention is directed to various methods that use the formation of mesas as the basis for further processing to form specific step structures. The principles of the methods of the present invention depend on, but go beyond, epitaxial film growth or etch processes, with a net result of well defined, crystallographically determined step-heights that are particularly suited for use in scanning probe microscopes and profilometers.

The method of the present invention produces a standardization artifact that better provides a series of reproducible physical steps of a known height on a sub-nanometer to multiple nanometer scale, in order to enable calibration of scanning probe microscopes (SPM or other instruments) with the capability of quantitatively measuring surface topography in manners known in the art.

The method of the present invention produces structural steps on a single-crystal device with a crystal basal plane and having a plurality of mesas. The method comprises the operational steps of: (a) selecting a single-crystal substrate from the group consisting of the hexagonal and rhombohedral polytypes of SiC; (b) preparing a planar first surface on the single-crystal substrate wherein the planar first surface is tilted by an angle of less than ten (10) degrees, but greater than zero (0) degrees with respect to the crystal basal plane; (c) removing material from the planar first surface so as to define a plurality of mesas with separated top second surfaces with characteristics of said top second surfaces selected from the group consisting of area, shape, and crystal orientation; and (d) providing crystallographically controlled formation of steps on the top second surfaces of the mesas by a process selected from the group consisting of (1) a step-flow etch, (2) a step-flow growth, and (3) a step-flow etch and a step-flow growth.

BRIEF DESCRIPTION OF THE DRAWINGS

FIG. 1 is composed of FIGS. 1A, 1B, 1C, and 1D, wherein

FIG. 10 is comprised of FIGS. 10A and 10B that illustrate collectively a further embodiment of the present invention, wherein the step-flow etch is carried out on a 3C-SiC single crystal heteroepitaxial film that has been grown on an atomically flat 4H-SiC mesa. The step-flow etch produces a pyramidal pattern of concentric plateaus that have a step-height of single bilayer (approximately 0.25 nm) between each plateau. The shape of the plateaus approximate the shape of the mesa.

DETAILED DESCRIPTION OF THE PREFERRED EMBODIMENTS

Figure 1A:
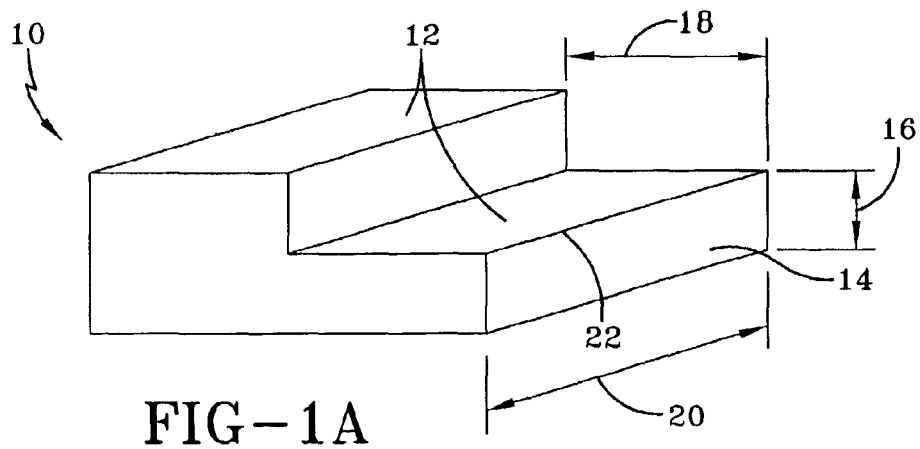
FIG. 1A illustrates a common step structure.
Figure 1B:
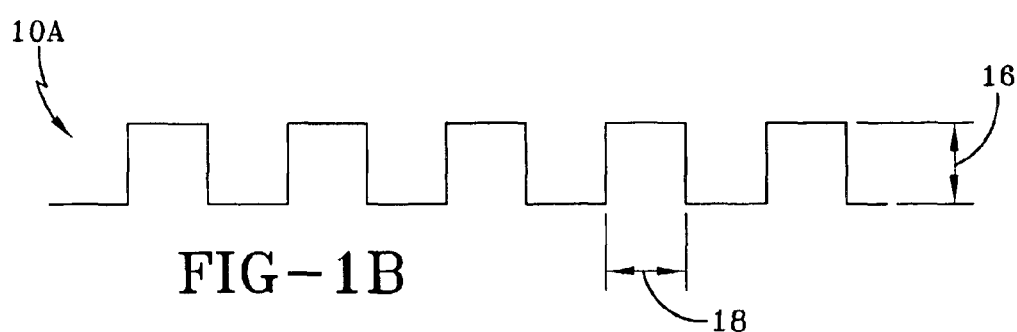
FIG. 1B illustrates a cross-sectional view of a square-wave step structure.
Figure 1C:
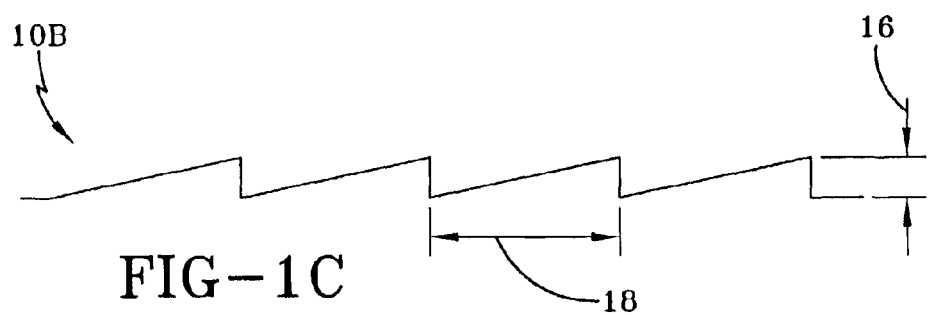
FIG. 1C illustrates a cross-sectional view of sawtooth step structure.
Figure 1D:
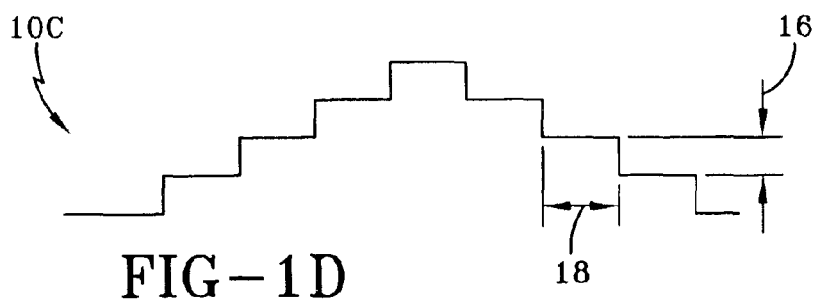
FIG. 1D illustrates a cross-sectional view of a pyramidal step structure.

The present invention is related to a product by process, wherein the product is primarily a step-height standardization artifact particularly suited for being used for scanning probe microscopes and profilometers. The artifact provides precision height reading as a function of the lateral position on a solid artifact serving as a step-height calibration surface or serving as a device to check instrument operation. More particularly, the various methods of the present invention produce a product comprising a diagnostic sample with nanometer scale steps for the purpose of producing a step-height calibration physical artifact used for instruments selected from the group consisting of scanning probe microscopes, profilometers and physical measurement devices.

The process of the present invention provides controlled formation of plateau height variations serving as steps of the product. The steps are provided by making use of etching and/or epitaxial film growth on SiC single crystals.

In general, the method of the present invention provides for structures serving as the artifacts and, more particularly, provides techniques for the fabrication of ordered arrangements of nanometer scale steps primarily placed on a single-crystal device, particularly comprised of SiC. In one embodiment, the structures consist of patterned arrays of mesas that are etched into a selected crystal plane. In all embodiments, the mesa pattern etched prevents undesired steps due to screw dislocations from propagating across one mesa to adjacent mesas, thereby allowing for the orderly fabrication of the desired structure serving as step-height standards on mesas without dislocations. Ordered atomic or nanometer scale steps are produced in the embodiments of the present invention on top of the surfaces of mesas without screw dislocations by a combination of growth and etching processes. These produced structures, serving as standard artifacts, are utilized to enable step-height calibration from less than 1 nanometer (nm) to greater than 10 nm, with substantially no atomic scale roughness on the plateaus on either side of any given step. The specific step-heights depend on the chosen single crystal polytype of SiC, the mesa configuration, and the formation process. In one embodiment, the lateral dimension (distance between steps, sometimes referred to herein as the step width) of the standardized artifacts may be calibrated on the order of micrometers.

One embodiment of the method of the present invention and the resulting devices produced therefrom may be further described with reference to FIGS. 1, 3, 4, and 5. The embodiment will be described for the case where the artifact is fabricated from a wafer comprised of the 4H polytype of SiC, but with the understanding that other polytypes are applicable to the practice of the present invention.

In general, the method of the present invention comprises: (a) selecting a single-crystal substrate from the group consisting of the hexagonal and rhombohedral polytypes of SiC; (b) preparing a planar first surface on the single-crystal substrate wherein the planar first surface is tilted by an angle of less than ten (10) degrees, preferably 0.1 degrees, but greater than zero (0) degrees with respect to the crystal basal plane; (c) removing material from the planar first surface so as to define a plurality of mesas with separated top second surfaces and with characteristics of the top second surfaces selected from the group consisting of area, shape, and crystal orientation; and (d) providing crystallographically controlled formation of steps on the top second surfaces of the mesas by a process selected from the group consisting of (1) a step-flow etch, (2) a step-flow growth, and (3) a step-flow etch and a step-flow growth.

Figure 2:
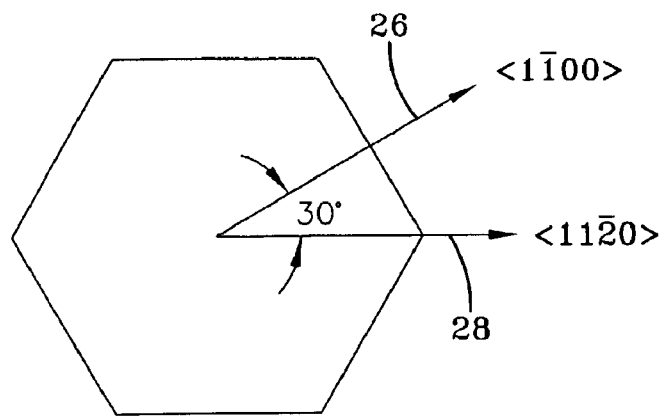
FIG. 2 illustrates the six-fold crystallographic symmetry and crystallographic directions of hexagonal SiC polytypes, such as 4H-SiC and 6H-SiC.

In one preferred embodiment the area of the top surfaces of the mesas is selected to be less than twice the inverse of the average density of extended crystallographic defects, known in the art, that intersect the planar surface. The details for this selection is more fully described in the previously incorporated by reference U.S. patent application Ser. No. 09/965,250 now U.S. Pat. No. 6,488,771, with reference to FIG. 13 thereof FIG. 2 illustrates a SiC hexagonal polytype having crystallographic directions 26 and 28. The <1$\bar{1}$00> direction 26, that is shown, is one of six equivalent directions that are perpendicular to the midpoint of each hexagonal side and is known as the facet direction. The <11$\bar{2}$0> direction 28, that is shown, is one of six equivalent directions that pass through each vertex of the hexagon and is known as the vertex direction (or the "a" direction). The directions 26 and 28 are displaced from each other by an angle of 30 degrees. The SiC hexagonal and rhombohedral polytypes possess tetrahedral bonding. The single crystal substrate may also be selected from the group consisting of 4H-SiC and 6H-SiC.

Figure 3A:
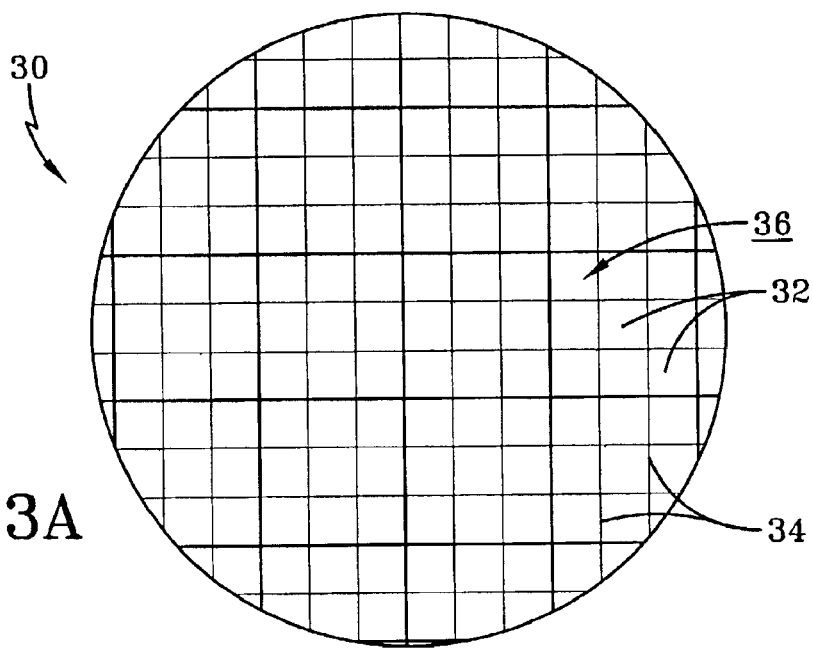
FIG. 3 is comprised of FIGS. 3A and 3B that illustrate a precursor to the embodiment of each of the methods of the present invention, namely the division of a semiconductor wafer surface into subareas, each called a mesa, by trenches, also called grooves. An actual physical object serving as an embodiment of the present invention may comprise a number of mesas, as illustrated in FIG. 3B.
Figure 3B:
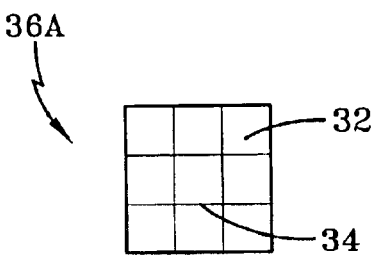

FIG. 3 is comprised of FIG. 3A and FIG. 3B. FIG. 3A illustrates a SiC wafer 30 from which the calibration artifacts (herein also called the devices) are fabricated. FIG. 3A also illustrates mesas 32 that are formed on the wafer in a manner more fully described in U.S. Pat. Nos. 5,915,194 and 6,165,874 of J. A. Powell et al, which are herein incorporated by reference. The mesas 32 have edges that are defined by trenches 34 and form the boundary of each mesa 32. FIG. 3A also illustrates the boundary and shape of individual devices 36 (i.e., the step height calibration standard) that are cut from the wafer 30. Each device 36 consists of an array of mesas 32 that may or may not be identical in size and shape. FIG. 3B illustrates a single device 36A after it has been cut from the wafer 30.

Figure 4A:
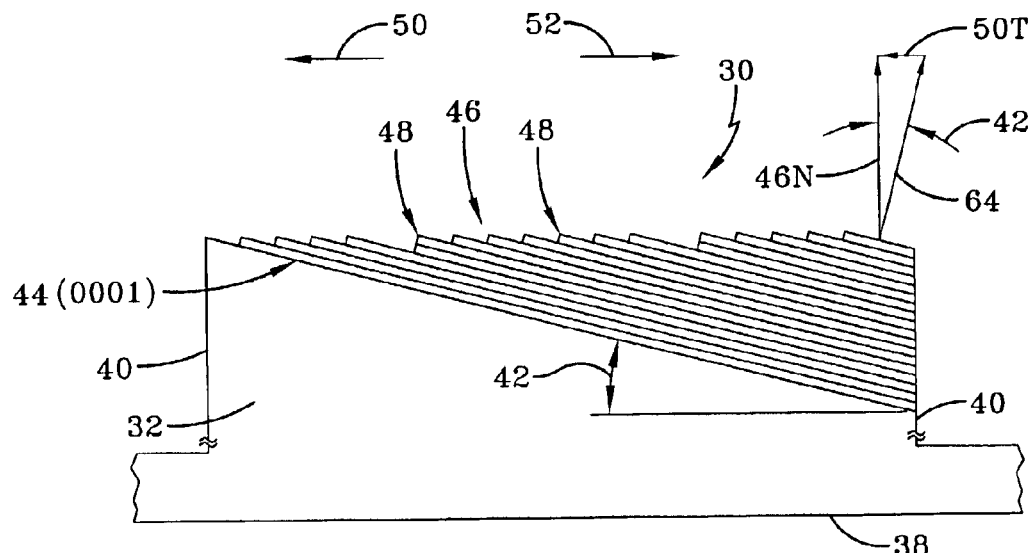
FIG. 4 is comprised of FIGS. 4A and 4B that illustrate, respectively, a side view and top view representation of a mesa for producing crystallographically controlled plateaus.
Figure 4B:
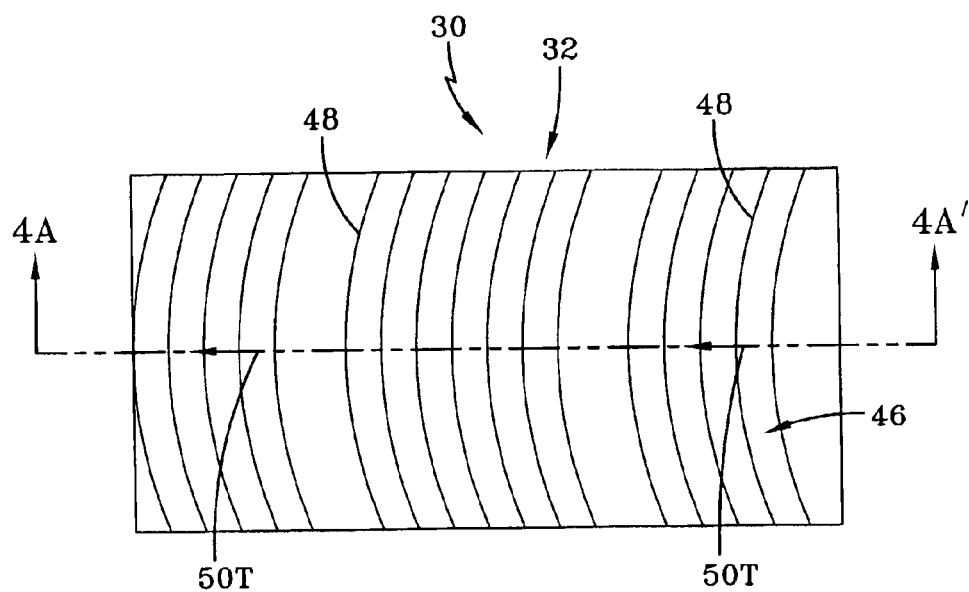

FIG. 4 is comprised of FIG. 4A and FIG. 4B. FIG. 4A illustrates a cross-section of a localized region of the wafer 30 that encompasses only a single mesa 32 shown in FIG. 3B. The wafer 30 has a bottom 38, mesas sides 40, a tilt angle 42, a basal plane (0001) 44, and a surface 46. The surface 46 has surface steps 48 due to the tilt angle 42 of the surface 46 with respect to the basal plane 44.

As referred to herein, the vector 50 of FIG. 4A is an approximate direction and is known as the down step direction because the surface steps 48 proceed downward from right to left in FIG. 4A. The vector 52 in FIG. 4A is also an approximate direction and is known as the up step direction because the surface steps 48 proceed upward from left to right in FIG. 4A. In FIG. 4B, the steps are curved, so the exact down step direction varies somewhat depending on the location on the mesa surface 46.

A more exact quantity than the down step direction is defined herein as the direction of tilt 50T, shown in FIGS. 4A and 4B (also referred to herein as the tilt direction). The direction of tilt of a surface 46 is defined at each location on the surface 46 by a vector parallel to the stepped surface 46 and whose direction is both in the down step direction and in a direction perpendicular to the step risers at the given location. The direction of tilt at a given location can also be thought of as the projection (onto the surface at the given location) of the vector connecting a basal plane normal 64 (i.e. parallel to the c-axis) with a vector surface normal 46N at the given location as shown in FIG. 4A.

The tilt angle 42 may be a predetermined tilt angle which is less than 2 degrees, or the predetermined tilt angle 42 may be approximately 0.1 degree and the crystallographic direction of tilt 50 thereof is approximately toward a <1$\overline{1}$00>direction, or the predetermined tilt angle 42 may be approximately 0.1 degree and the crystallographic direction of tilt 50 thereof is approximately toward a <11$\overline{2}$0>direction. Note that in FIG. 4A, surface steps 48 progress from one side 40 of the mesa to the opposite side 40, because of the tilt of the planar surface 46 away from the crystal basal plane 44. In FIG. 4A, the surface is considered to be tilted to the left, toward what is defined to be the down step direction shown by directional arrow 50. The opposite direction is defined to be the up step direction shown by directional arrow 52.

FIG. 4B illustrates a top view of the steps 48 on the mesa surface 46. The pattern and step-height of the steps 48 are not well defined and subject to the previous processes to which the wafer 30 has been subjected. Previous prior-art processes to which the whole wafer may have been disadvantageously subjected include: cutting of the wafer from a boule, polishing of the wafer surface, ion etching of the polished surface to remove subsurface damage, and hydrogen etching of the whole wafer to produce some organized steps on the surface. The steps shown in the schematic drawings of FIGS. 4 and 5 (to be further described) are for illustration of the concept of the present invention only; the actual number of steps 48 on a real mesa 32 is much larger.

The density and distribution of crystal defects (e.g. screw dislocations) play a large role in determining the pattern of steps 48. One purpose of dividing the wafer surface into individual mesas 32 shown in FIG. 3, in the practice of the present invention, is to isolate the screw dislocations so that surface steps 48 generated by a single screw dislocation only impact the step pattern in a single mesa 32. Screw dislocations contribute to surface steps 48 in a detrimental manner since they generate steps that interfere with the desired orderly step-flow etching or growth that produce the desired pattern of structural steps.

Figure 5A:
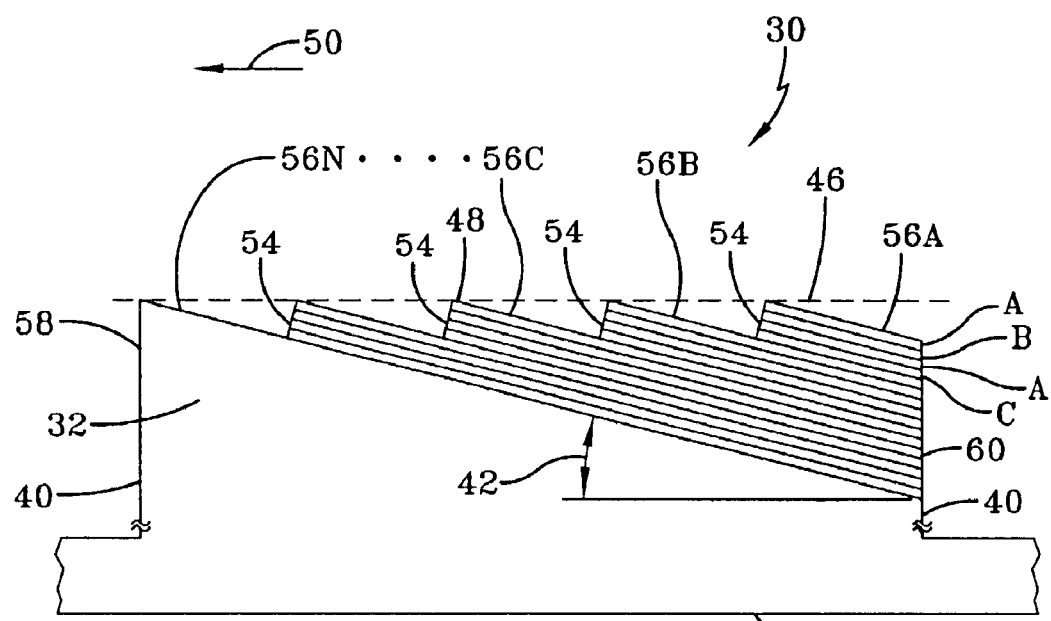
FIG. 5 is comprised of FIGS. 5A and 5B that illustrate, respectively, a side view and top view representation of a 4H-SiC embodiment of the present invention wherein a step flow etch process has resulted in unit height steps on the mesa surface. The 4H-SiC mesa shown in FIG. 5 is free of screw dislocations.
Figure 5B:
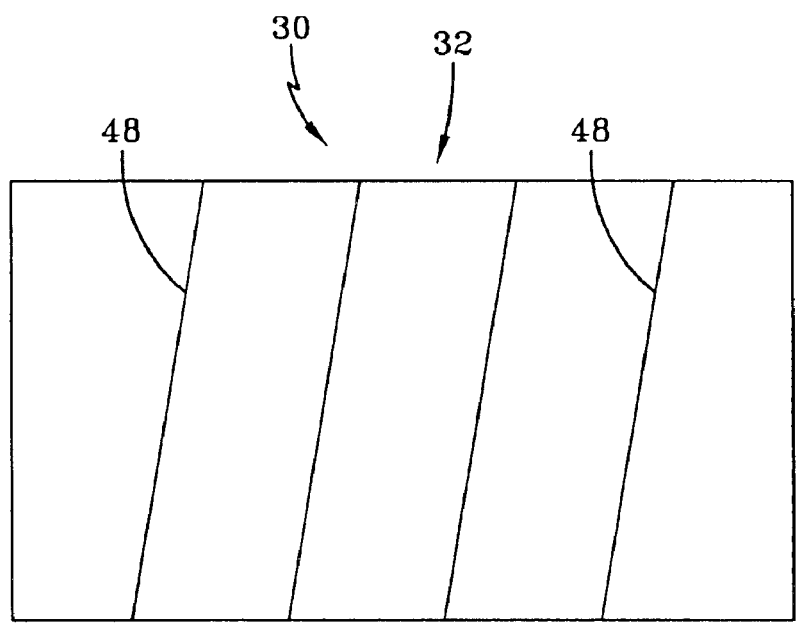

In one embodiment of the invention, the wafer 30 of FIG. 3A (or the device 36A of FIG. 3B) is subjected to a step-flow etch, which may be further described with reference to FIG. 5 comprised of FIG. 5A and FIG. 5B, wherein FIG. 5A is cross-section of a mesa 32 at a localized region of a 4H-SiC wafer 30 and FIG. 5B is a top view of the steps 48 of the mesa surface 46 of FIG. 5A after the step-flow etch. In this embodiment, it is assumed that the areas of the mesas are chosen to be small enough and that there is a reasonable percentage of mesas that do not contain any screw dislocations. Also, assume that the mesa of FIG. 5 is one that does not contain any screw dislocations. For the embodiment illustrated in FIG. 5, the down step direction 50 is preferably selected toward a <1$\overline{1}$00>direction, but may be other directions as well.

The steps 48 are comprised of four (4) bilayers, such as A, B, A, C, as shown in FIG. 5A. Because the mesa in FIG. 5A is free of screw dislocations, the surface steps 48 evolve from the initial condition of being chaotic 48 (as shown in FIGS. 4A and 4B) to an orderly array of steps 48 (as shown in FIGS. 5A and 5B) with a unit height 54 of four SiC bilayers 54 as shown in FIG. 4A. An essential aspect of this embodiment is the isolation of mesas without dislocations from those mesas with dislocations. Also, because the planar surface 46 is tilted with respect to the basal plane, the resulting steps 48 evolve during the step-flow etch as the initial steps move in the direction 52 from the left side 40 of the mesa 32 in FIG. 4 toward the right side 40 of the mesa 32.

The step-flow etch, known in the art, is preferably provided by a high temperature (greater than 1000° C., but less than 2000° C.) vapor in a chemical vapor deposition (CVD) system selected from a vapor consisting of hydrogen, hydrogen plus hydrogen chloride, or a mix of hydrogen with other gases selected from the group consisting of hydrocarbons, inert gases, and oxygen.

The step-flow etch provides for crystallographic controlled formation of steps 48 on the planar surface 46 of the mesa 32 resulting in plateaus 56A, 56B, 56C, . . . 56N, that start from the upstep edge indicated in FIG. 5A by reference number 60, and extend across the single-crystal mesa to the downstep side indicated in FIG. 5A by reference number 58 of the mesa as shown in FIG. 5A. Each step 48 has a uniform height 54 equal to the c-axis repeat distance of 4H-SiC (A, B, A, C) as seen in FIG. 5A. More particularly, the uniform height 54 is measured between adjacent plateaus (e.g., between 56A and 56B) as shown in FIG. 5A. Further, each step 48 consists of a particular plateau, such as 56A, and its corresponding height 54.

An advantageous selection for the mesa area, applicable to all embodiments of the present invention, is for the area to have a characteristic that is less than the inverse of the average density of extended crystallographic defects that intersect the wafer surface. The determination of the average density of extended crystallographic defects is known in the art. This selection will increase the yield of mesas that are free of dislocations and hence increase the yield of mesas with the desired structural steps produced by the practice of the present invention.

Another advantageous selection for the present invention is that the polytype of the single-crystal substrate of FIG. 2 can be selected from the group consisting of 4H-SiC or 6H-SiC. Also, the single-crystal substrate of FIG. 2 can be a 3C-SiC film, which can be grown on a hexagonal or rhombohedral SiC substrate by prior art processes.

Other advantageous selections for the present invention are the shape and orientation of the mesa surface. The shape can be selected from the group consisting of squares, rectangles, hexagons, and polygons where one edge of the selected shape can be advantageously parallel to the <1$\overline{1}$00> or <11$\overline{2}$0>crystallographic directions of the single crystal substrate of FIG. 2.

Also, the process of the present invention for forming the desired structural steps can be a step-flow etch provided by a sublimation process carried out in a suitable growth/etching system at a temperature in excess of 1800 degrees C., but less than 2500° C.

Also, the process of forming the desired structural steps of the present invention can be provided by a step-flow growth under conditions that inhibit two-dimensional nucleation on the mesa surfaces. This growth should be carried out for a length of time dependent on tilt angle 42, mesa size and shape, and growth conditions (temperature, gas concentrations, flow rates, etc.). All parameters should be optimized to produce the desired structural steps 48 on the mesas 32. In the embodiment illustrated in FIG. 4 and FIG. 5, the process growth time should be limited so that all of the structural steps 48 will not be grown out of existence as predicted by prior art processes.

An additional process utilized by the present invention for forming the desired structural steps can be provided by a combination of a step-flow etch process and a step-flow growth process. An advantage of such a combination is the following example. Under some conditions, a step-flow etch can produce some rounding of step shapes near the edge of a mesa. If an appropriate step-flow growth process would be carried out after the step-flow etch, the undesired rounding effect could be eliminated by the step-flow growth. The growth time in this case is selected to be much shorter than the growth time that would be required to grow the steps out of existence (as predicted by prior art).

An additional modification for preferred embodiments of the present invention includes removing additional material from the initial planar surface of the single crystal substrate in a manner so as to produce an identifying marker for each mesa so that each mesa can be located on the single-crystal device for later calibration and use purposes.

A second embodiment of the method of the present invention and the resulting device produced therefrom particularly suited for use with instruments, may be further described with reference to FIG. 6A, FIG. 6B, FIG. 7A, FIG. 7B, and FIG. 7C.

Figure 6A:
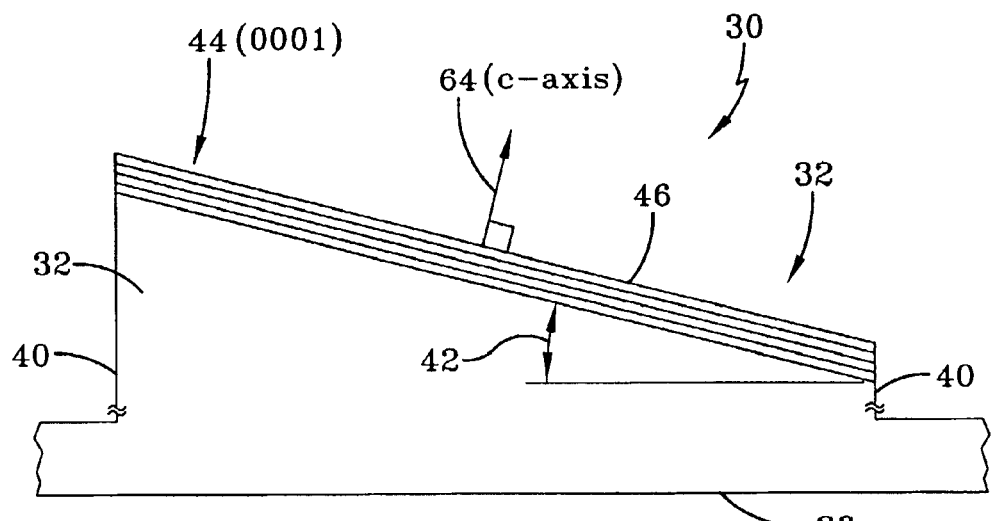
FIG. 6 is comprised of FIGS. 6A and 6B that illustrate, respectively, a side view and top view representation of a method of the present invention wherein a step-flow growth process has resulted in elimination of crystallographic steps on a mesa, producing an atomically flat surface.
Figure 6B:
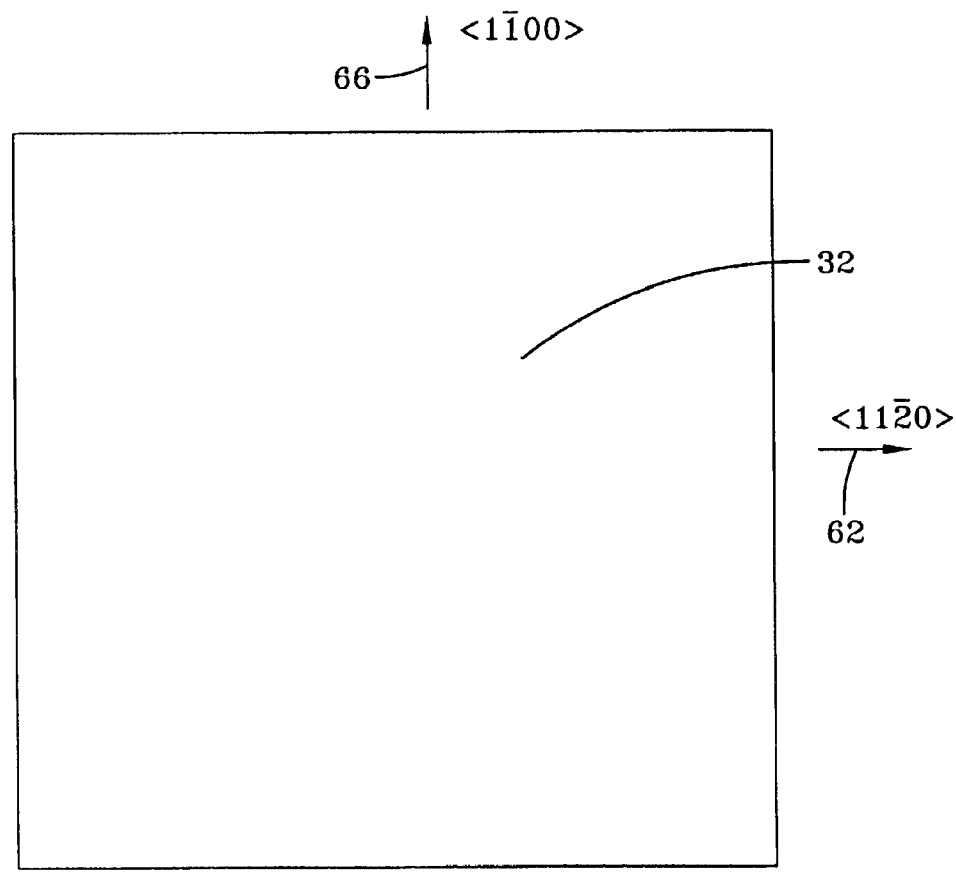

FIG. 6A illustrates a cross-section of one mesa 32 of a plurality of mesas 32 on a wafer 30 that may be produced in a manner more fully described in U.S. Pat. No. 5,915,194, whereas FIG. 6B is a top view of the mesa 32 of FIG. 6A. The single-crystal mesa 32 has a bottom 38, mesas sides 40, a tilt angle 42, a basal plane 44 (0001), and an atomically-flat mesa surface 46, which is produced by a step-flow growth process. The single-crystal mesa 32 of FIG. 6A is more fully described in the technical article of J. A. Powell et al, entitled "Growth of Step-Free Surfaces on Device-Size (0001) SiC mesas," published in *Applied Physics Letter*, Vol. 77, No. 10, pp 1449–1451 (2000) and herein incorporated by reference.

One preferred configuration is that the single-crystal mesa 32 of FIG. 6 has a square shape, as shown in FIG. 6B, and is comprised of a hexagonal SiC polytype. The mesa 32 of FIG. 6 has crystal orientation defined by directions 62, 64 and 66 shown in FIG. 6 where direction 64 is in the c-axis direction shown in FIG. 6A, direction 62 is in the <11$\overline{2}$0>direction, and direction 66 is in the <1$\overline{1}$00>direction shown in FIG. 6B. The mesa 32 (or devices) with atomically flat surface and square shape of FIG. 6B is subjected to a step-flow etch, which after the step-flow etch, may be further described with reference to FIGS. 7A, 7B, and 7C, shown as having steps 48.

Figure 7A:
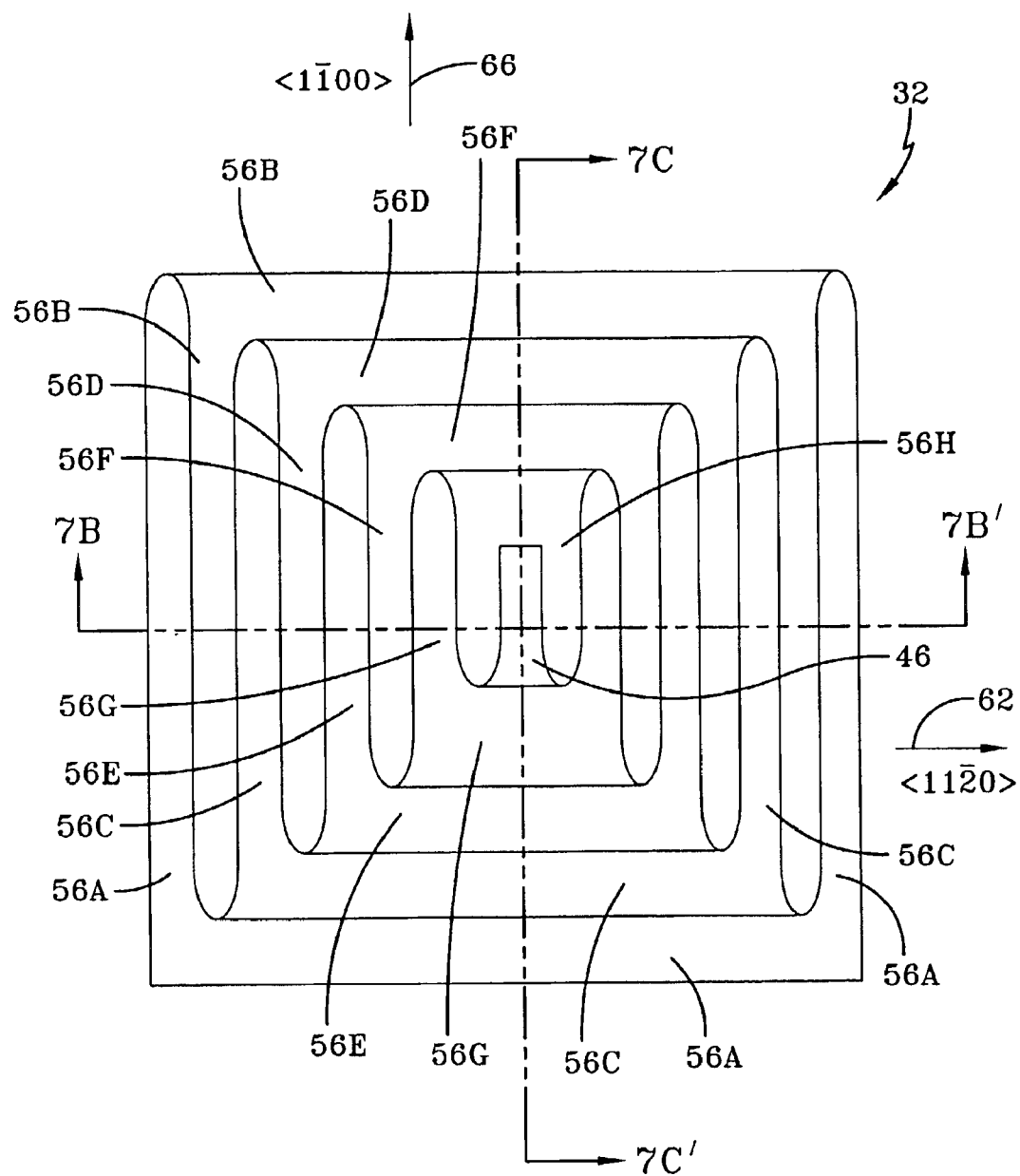
FIG. 7 is comprised of FIGS. 7A, 7B, and 7C that illustrate collectively a further embodiment of the present invention, wherein a step flow etch process carried out on the atomically flat mesa of FIG. 6 results in two distinct step heights on a square mesa surface. Considering 4H-SiC for this example, a properly oriented, rectangular mesa with initially atomically flat surface (shown in FIG. 6), when subjected to a step flow etch, develops two types of steps between atomically flat plateaus.
FIG. 7B illustrates a side view taken along line 7B–7B' of the FIG. 7A top view, wherein each of the step heights in FIG. 7B is one half the unit height, about 0.5 nm for 4H-SiC (actually, two bilayers).
FIG. 7C illustrates the unit height steps, about 1.0 nm, along the facet direction, <1$\bar{1}$00> defined by the view taken along line 7C–7C' of FIG. 7A.
Figure 7B:
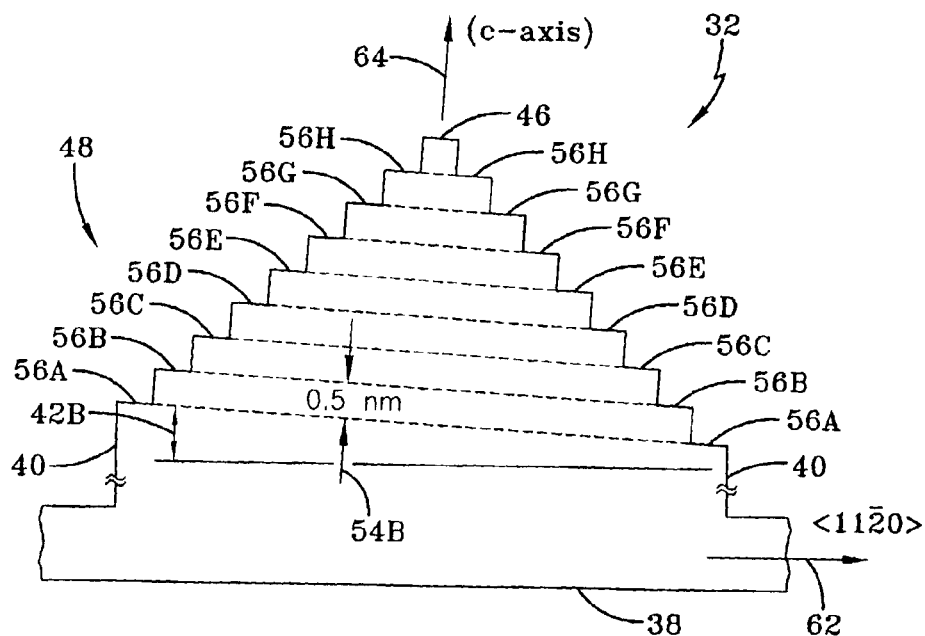
Figure 7C:
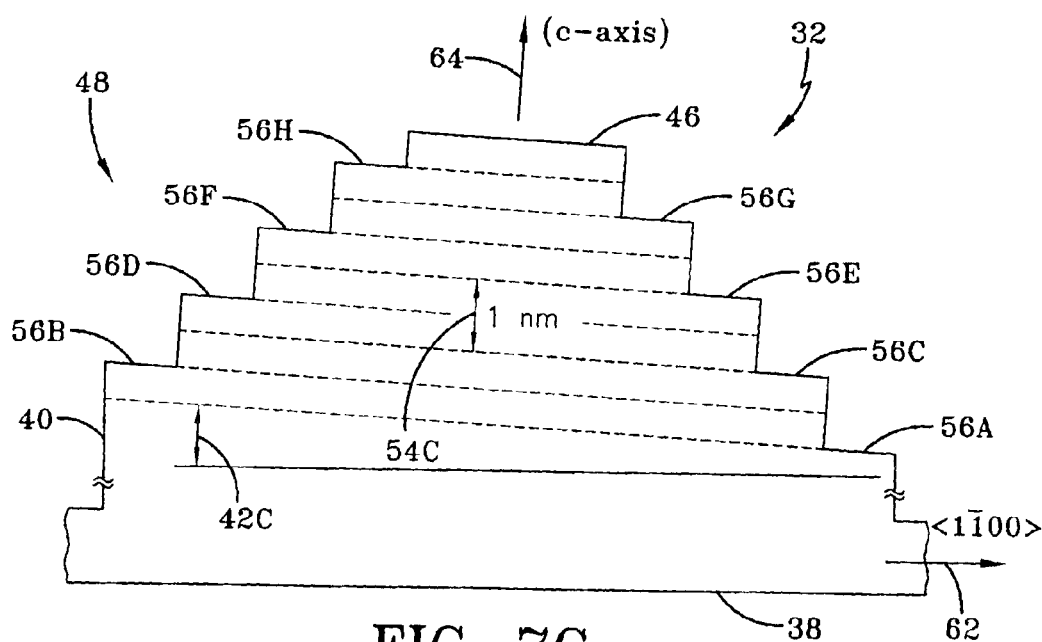

FIG. 7 is a schematic illustration of mesa 32 after the step-flow etch has formed the desired pattern of steps. FIG. 7 is composed of FIGS. 7A, 7B, and 7C, wherein (1) FIG. 7A is a top view illustrating the interleaved pattern of plateaus forming the desired steps, (2) FIG. 7B is a cross-sectional side view of mesa 32 at line 7B–7B' which is parallel to the <11$\overline{2}$0>crystallographic direction 62, and (3) FIG. 7C is a cross-sectional side view of mesa 32 at line 7C–7C' which is parallel to the <1$\overline{1}$00>crystallographic direction 66.

FIG. 7A most clearly shows the square boundary of the mesa 32, its top surface 46, and the pattern of U-shaped interleaved plateaus comprised of plateaus 56A, 56B, 56C, 56D, 56E, 56F, 56G, and 56H. In the interleaved portion of the plateaus, along the line 7B–7B', the step-heights 16 between the plateaus are 0.5 nm as shown in FIG. 7B by reference number 54B. In the non-interleaved portion of the plateaus, along the line 7C–7C', the step-heights 16 are 1.0 nm as shown in FIG. 7C by reference number 54C. The plateaus 56A, 56C, 56E, 56G, 56B, 56D, 56F and 56H of FIG. 7C are referenced to the bottom 38 by a tilt angle 42C.

A desired result of this embodiment is that step-heights along the line 7C–7C' (parallel to the <1$\overline{1}$00> crystallographic direction 66) shown in FIG. 7C are equal to the unit height of 4H-SiC (approximately 1.0 nm) and the step-heights along the line 7B–7B' (parallel to the <11$\overline{2}$0>crystallographic direction 62) shown in FIG. 7B are equal to half of the unit height of 4H-SiC (approximately 0.5 nm). Hence, this embodiment simultaneously produces two useful sets of step-heights on the same mesa, one set of steps 48 equal to the unit height of the selected SiC polytype previously discussed with reference to FIG. 5A and identified by reference number 54, and one set of steps 48 equal to half of the unit height of the selected SiC polytype. In addition, the steps 48 are conveniently oriented roughly parallel to the edges 40 of the mesas 32 on the single crystal device. The formed product may be used as a diagnostic sample with atomic or nanometer sized steps for the purpose of producing a step-height calibration physical artifact for use with scanning probe microscopes, profilometers, and other physical measurement devices. Another beneficial feature of this embodiment is that both step-heights are located in close proximity on the same mesa, which allows a single measurement to capture both step-heights. There is substantially no atomic scale roughness of the plateaus created by the step-flow etching. The structural steps 48 of FIGS. 7B and 7C are produced by a step-flow etch process known in the art.

An additional variation in this embodiment is to use a rectangular mesa 32, to be further described hereinafter, instead of a square mesa 32 shown in FIG. 6B, and select a specific length to width aspect ratio for the rectangle. By making the rectangle sufficiently longer in the <11$\overline{2}$0>crystallographic direction 62 compared to the <1$\overline{1}$00>crystallographic direction 66, the 1.0 nm (i.e. unit height) steps 48 can be made longer than the 0.5 nm (i.e. half unit height) steps 48. By making the rectangle sufficiently longer in the <1$\bar{1}$00>crystallographic direction 62, the 0.5 nm steps 48 can be made longer than the 1.0 nm steps 48. The same principle can be applied to the other SiC hexagonal and rhombohedral polytypes used for the single-crystal substrate 30 of FIG. 3A.

The step-flow etch is preferably provided by a high temperature vapor in a chemical vapor deposition (CVD) system selected from a vapor consisting of hydrogen or hydrogen plus hydrogen chloride, or a mix of hydrogen with other gases such as hydrocarbons, inert gases, and/or oxygen. If desired, the step-flow etch may be incorporated into the process of the U.S. Pat. Nos. 5,915,194 and 6,165,874 that produced the device 36A of FIG. 3A, while the device 36A is in-situ and may be accomplished immediately after the growth step used to produce atomically-flat surfaces 46 of mesa 32.

In the case of a square shaped mesa of FIG. 6, the step-flow etch provides for crystallographic controlled formation of steps 48 having interleaved U-shaped plateaus 56A, 56B, . . . 56N, that start from the edge 40 of the single-crystal mesa 32 and extend toward the middle of the mesa 32 and sequentially increase in height. The crystallographic orientation of the sides of the square mesa is essential to obtaining the pattern of structural steps shown in FIG. 7.

In general, the mesa 32 of FIG. 7 is defined by boundaries which are rectangular and whose rectangular sides have two sides parallel to the crystal <11$\bar{2}$0> direction 62 and two sides parallel to the <1$\bar{1}$00>direction 66 so as to produce two sets of structural steps, wherein one set of steps is parallel to the <11$\bar{2}$0>direction 62 and one set is parallel to the <1$\bar{1}$00>direction 66, and additionally one set of steps (FIG. 7C) is twice the height of the other set (FIG. 7B).

A further embodiment of a method of the present invention for providing crystallographically controlled formation yielding desired structural steps may be further described with reference to FIG. 8 comprised of FIGS. 8A, 8B, 8C, 8D, and 8E. In general, FIG. 8 illustrates a series of interconnected grooves, to be further described, allowing the formation of multiple-unit height steps by providing for crystallographically controlled formation of plateaus extending across single-crystal mesas and serving as steps thereon.

A specific example with a 4H-SiC substrate will be used to demonstrate the concept of this embodiment as illustrated in FIG. 8. This embodiment is partially based on observations that hexagonal SiC polytypes form stable steps of unit height during step-flow etching in the <1$\bar{1}$00>crystallographic directions (and also somewhat less so in the <11$\bar{2}$0>crystallographic directions). Further details may be found in the paper by S. Nakamura, T. Kimoto, H. Matsunami, S. Tanaka, N. Teraguchi, and A. Suzuki, "Formation of Periodic Steps with a Unit-Cell Height on 6H-SiC (0001) surface by HCl etching", published in Applied Physics Letters, Vol. 76, No. 23 (2000) pp. 3412–3414. Also, other prior art growth processes indicate that unit height steps can be produced during step-flow growth. This behavior was reported by Stephane Tyc in "Structure of a 6H Silicon Carbide Vicinal Surface", Silicon Carbide and Related Materials, edited by M. G. Spencer, R. P. Devaty, J. A. Edmond, M. Asif Khan, R. Kaplan, and M. Rahman, Institute of Physics Conference Series, No. 137, Institute of Physics Publishing (1994).

With reference to FIG. 8, the method related to the present invention comprises the following operational steps (a)–(f), wherein step (a) selects a single-crystal substrate from the group consisting of the hexagonal and rhombohedral polytypes of silicon carbide; in this example, 4H-SiC is selected. Step (b) prepares a planar first surface on the 4H-SiC single-crystal substrate, wherein planar first surface is tilted with respect to the crystal basal plane by approximately 0.1 degrees toward the <1100>crystallographic tilt direction. It should be noted that this first surface should be prepared in a manner that minimizes subsurface damage. Step (c) etches the first surface under selected step-flow etch conditions so as to remove any removable sources of steps and any unwanted crystal nucleation and also to produce a modified first surface with some structural steps with a step-height equal to the unit height of 4H-SiC and with an average step-to-step separation distance d, to be further described hereinafter with reference to FIG. 8B. For commercial SiC wafers, there will be some localized interference in the formation of ordered unit height steps during the step-flow etching process due to the high density of dislocations and other defects present in the wafer.

At this point in the process of the present invention there will be a planar surface with at least some structural steps with a unit height (i.e. 1.0 nm for 4H-SiC). The localized regions of the wafer surface where dislocations interfere with the orderly formation of unit height steps are not shown in the particular small portion of the wafer shown in FIG. 8A.

Figure 8A:
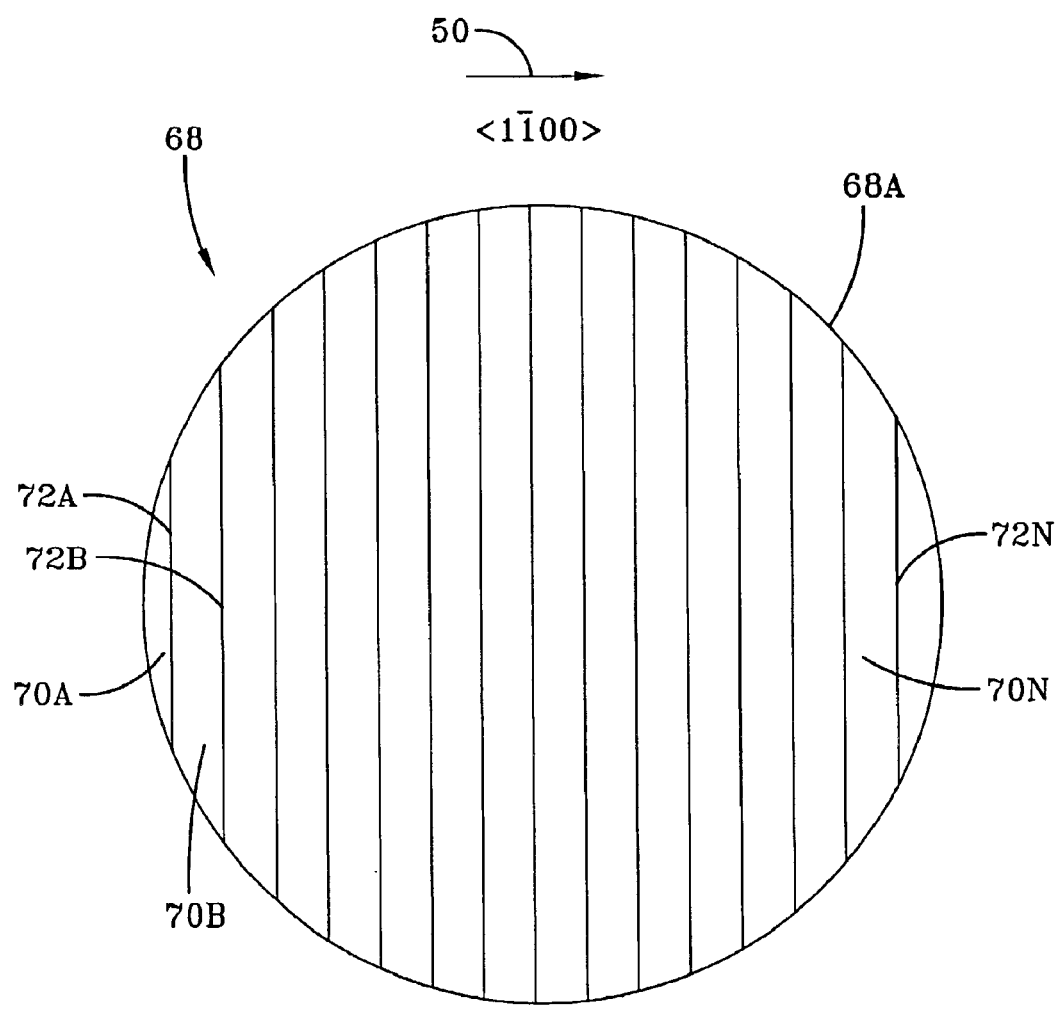
FIG. 8 is comprised of FIGS. 8A, 8B, 8C, 8D, and 8E that cumulatively illustrates another embodiment of the present invention, wherein a series of interconnected grooves allow the formation of multiple-unit height steps by providing for crystallographically controlled formation of plateaus extending across a single-crystal device and serving as steps thereon.

As seen in FIG. 8A, the localized surface region 68A in FIG. 8A is comprised of plateaus 70A, 70B, . . . 70N, respectively, separated by steps 72A, 72B . . . 72N that are oriented with the down step direction 50 directed toward the right side in FIG. 8A. The down step direction 50 has been defined with reference to FIG. 4A and is preferably in the <1$\bar{1}$00>direction. During a step-flow etch on this surface 68A, the steps 72A, 72B . . . 72N regress toward the left side; during a step-flow growth, the steps 72A, 72B . . . 72N grow laterally toward the right side as viewed in FIG. 8A. The step-flow etch is preferably carried out in any suitable growth/etching system at a temperature greater than 1000° C., but less than 2000° C. in a vapor selected from the group of vapors consisting of (1) hydrogen, (2) hydrogen plus hydrogen chloride, (3) and a mix of hydrogen with other gases such as hydrocarbons, inert gases, and/or oxygen.

Figure 8B:
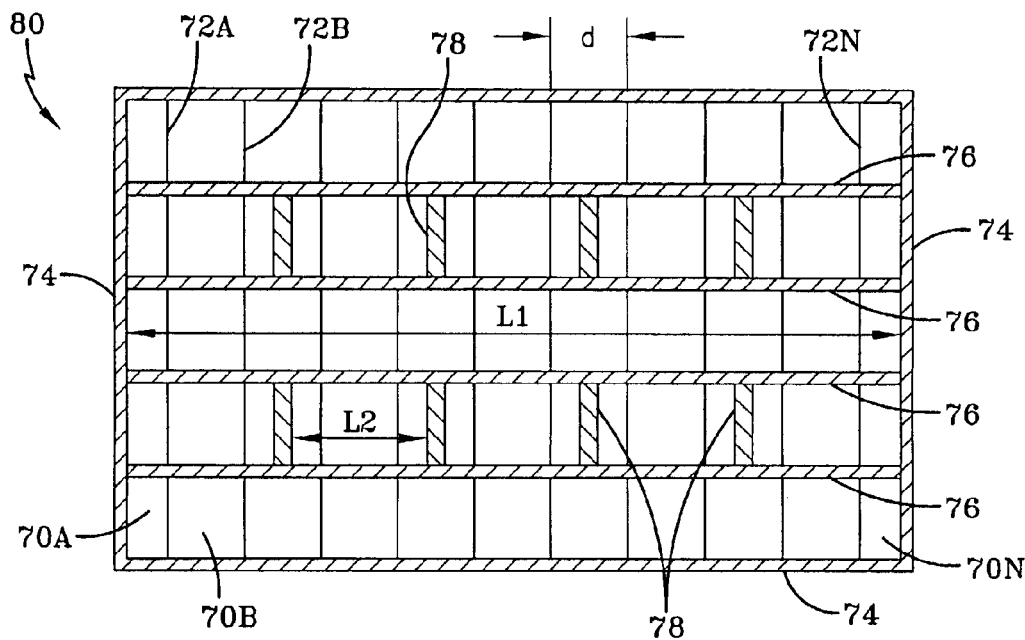

With reference to FIG. 8B, the method of the present invention continues with step (d) to remove material in the modified planar first surface so as to produce grooves 74, 76, and 78 that define arrays 80 of separated top second surfaces and separated top third surfaces as shown in FIG. 8B. The array defined by enclosing groove 74 (around the periphery of the array) consists of the separated top second surfaces and top third surfaces defined by grooves 76 and 78 as illustrated in FIG. 8B. The longer grooves 76 are parallel to the downstep direction 50 (preferably a <1$\bar{1}$00> crystallographic direction) shown in FIG. 8A and the shorter grooves 78 are perpendicular to long grooves 76. Within each array 80, the parallel grooves 76 run the length of the array. The perpendicular grooves 78 connect some adjacent long grooves 76, dividing some of the long strips between the long grooves into shorter strips, as seen in FIG. 8B.

The result of step (d) of the present invention is to produce a series of parallel ladder patterns within each enclosing groove 74. As seen in FIG. 8B, the long strips between the ladder patterns (i.e. the separated top second surfaces) have a first length L1 and contain the sequence of steps 72A, . . . 72N. The shorter grooves 78 form the rungs of the ladders and divide up the ladder strip into short rectangular surfaces (i.e. the separated top third surfaces) with second lengths L2.

Figure 8C:
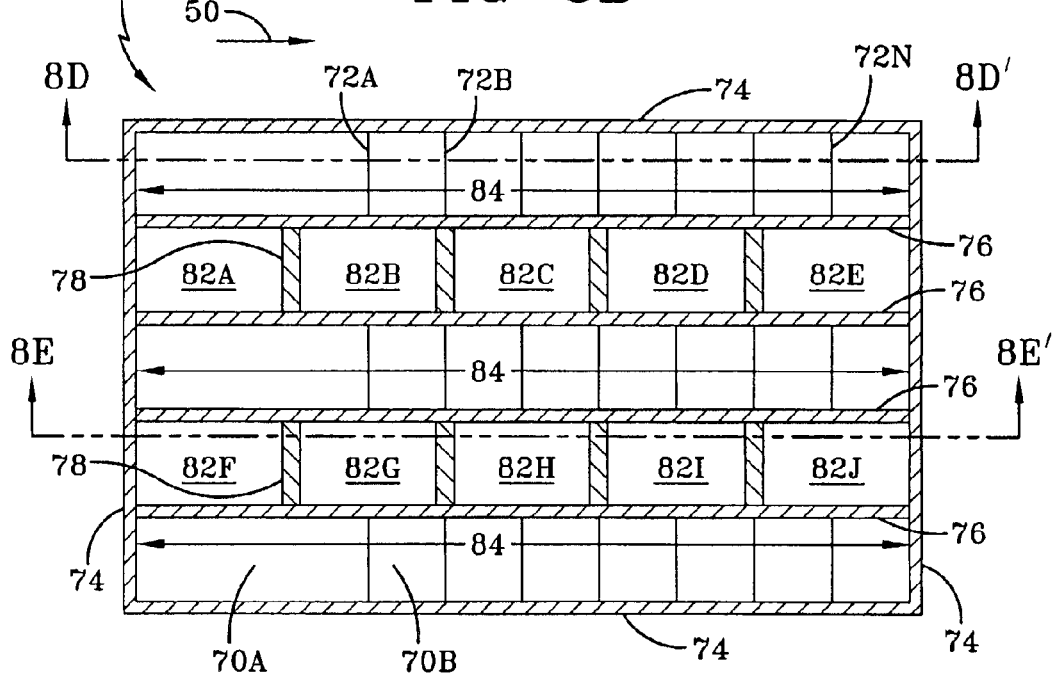

As seen in FIG. 8C, the distance between the grooves 78 is shown as defining regions, such as regions 82A, 82B, 82C, 82D, 82E, 82F, 82G, 82H, 82I, and 82J which, in turn, define the separated top third surfaces. The distance between adjacent short grooves 78 is varied in a predetermined manner so as to define the lengths L2 of regions 82A, . . . 82J.

The method of the present invention related to FIG. 8 continues with steps (e) and (f), wherein step (e) carries out a homoepitaxial film growth over the arrays 80 of top second surfaces and top third surfaces under selected conditions so as to provide a step-flow growth while suppressing two-dimensional nucleation. Step (f) continues the deposition of the homoepitaxial film just long enough that the step-flow growth obtains an atomically-flat epitaxial film surface on the top third surfaces (i.e., the surfaces between the rungs of the ladder e.g., 82A . . . 82J), but not long enough to eliminate all steps from the top second surfaces (i.e. the long strip surfaces between the ladders for example, shown in FIG. 8C as 84). The time required to achieve atomically-flat top third surfaces depends on the parameters of the growth process (e.g., temperature, gas flow rate of the silicon and carbon containing gas species, etc.), the angle of tilt of the top third surface relative to the basal plane, and the length L2. The result of this growth is shown in FIG. 8C. Because of the step-flow growth (lateral growth of steps toward the right side of FIG. 8C), the steps on the top third surfaces grow out of existence creating atomically flat surfaces on these surfaces as predicted by prior art U.S. Pat. Nos. 5,915,194 and 6,165,874. The step-flow growth eliminates any steps in the regions 82A . . . 82J, so as to provide an atomically flat surface thereof. The steps 72A . . . 72N on the top second surfaces also grow laterally toward the right side, but because of the longer length L1 compared to L2, the only effect is to produce a short atomically flat strip on the left side of the top second surfaces. There will now be vertical displacements between adjacent top third surfaces that are an integer multiple N of the unit height of the polytype of the substrate crystal 30 of FIG. 3A, and the multiple will increase as the ratio of the second length L2 to the distance d, shown in FIG. 8B, increases. The value of the multiple N can be determined by the ratio of L2 to d. For example, a ratio value will yield two times the unit repeat height for most of the vertical displacements. The vertical displacement between successive top third surfaces is quantized to a value N times the unit height for most of the vertical displacements along a particular ladder of top third surfaces. Because of the quantized nature of the vertical displacements, those that vary by one count from the dominant value of N for a given ladder pattern will be easy to discern during a measurement process. Hence, the value of any given vertical displacement can be determined from the value of the unit height without a calibration process since the value of d and L2 will be available from horizontal length measurements on the single crystal device produced by the practice of the present invention.

Figure 8D:
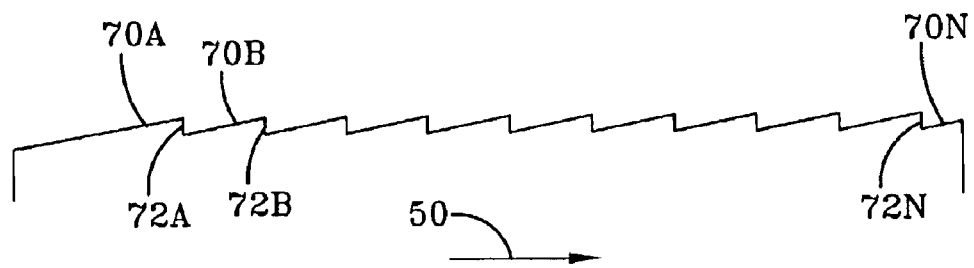
Figure 8E:
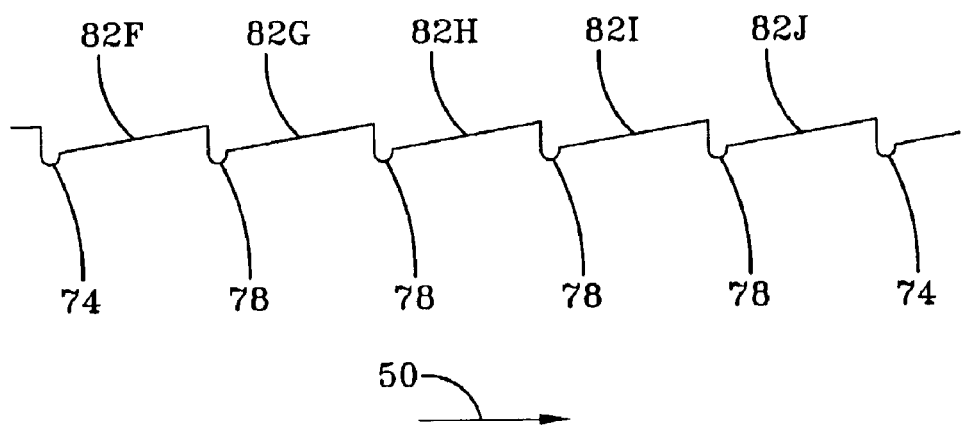

FIG. 8D shows a cross-sectional view of the steps 72A, 72B . . . 72N along the line 8D–8D' on the long strips between the ladders (the top second surfaces). FIG. 8E shows the a cross-sectional view of successive top third surfaces 82F, 82G, 82H, 82I, and 82J with grooves 78 in between along the line 8E–8E'.

In this embodiment of FIG. 8, the multiple N is selected for a given array of top second surfaces and top third surfaces by choosing the length L2 of the top third surfaces relative to the distance d. Different values of N can be selected in this manner for different arrays on a given single crystal device produced by the practice of the present invention.

Although a specific pattern (i.e. the parallel ladder pattern) was chosen to illustrate the concept of the embodiment of FIG. 8, many other patterns could be chosen to implement the concept.

A further embodiment of the present invention that provides for crystallographically controlled formation of plateaus may be further described with reference to FIG. 9.

Figure 9A:
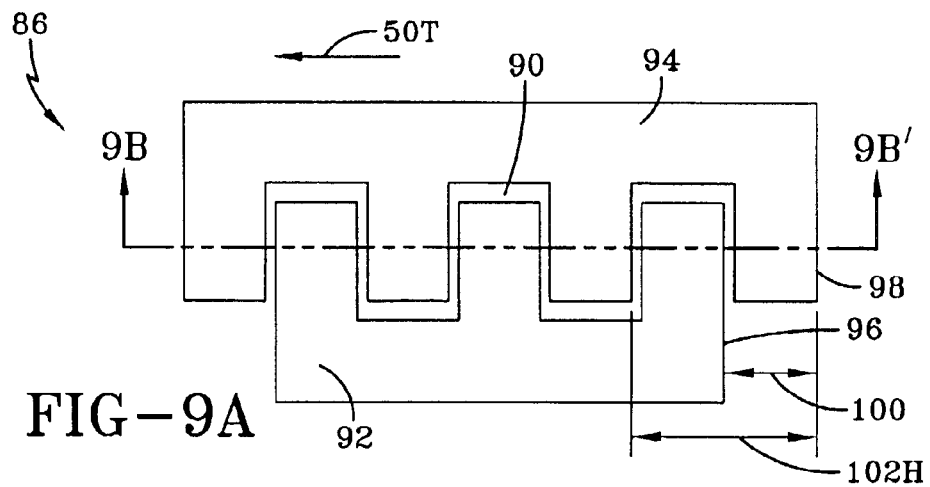
FIG. 9 is comprised of FIGS. 9A, 9B, and 9C that cumulatively illustrate another embodiment of the present invention, wherein crystallographically controlled formation of atomically flat plateaus in an interdigitated pattern on a single crystal wafer produces a precise fixed step-height from plateau to plateau.

In general, the embodiment of FIG. 9 is provided by crystallographically controlled formation of steps comprising the operational steps of first selecting a predetermined tilt angle 42, shown in FIG. 4A, to be approximately 0.1 degree and the crystallographic direction of tilt to be the <1 1̄00>direction also shown in FIG. 4A, and previously described with reference to FIG. 8. The operational steps then selects a pattern of mesas so that pairs of mesas form interdigitated patterns having interdigitated fingers and each pair of mesas has an upstep extent in a manner to be described. The pattern of pairs of mesas is selected so that (i) elongated interdigitated fingers are oriented perpendicular to the tilt direction; (ii) the upstep extent of each pair of mesas is so that one of the mesas of each pair extends slightly further in its upstep extent than the other mesa of each pair by a fixed amount selected to produce a vertical displacement therebetween; and (iii) performing the selected step-flow growth to produce step-free surfaces on the mesas and so as to produce pairs of mesas whose step-free surfaces are displaced vertically by a fixed amount relative to each other in the pair.

FIG. 9 illustrates an oriented single-crystal device 86 that is provided by a step-growth in the downstep direction 50T, which preferably is chosen to be in alignment with a crystal facet direction 26 of FIG. 2 (i.e., <1 1̄00>crystallographic direction). A patterned etch is performed to provide trenches 90 dividing the surface 86 into adjacent mesas 92 and 94. The mesa 92 has a maximum upstep position 96 and the mesa 94 has a maximum upstep position 98. The difference between the positions 96 and 98 is an offset distance 100.

The trench 90 closely groups the two or more adjacent mesas 92 and 94 so as to provide a standard height application. For example, the trench 90 provides a lateral interdigitation that would enable a simple profile/AFM scan. The trench 90 may also be chosen to provide horizontal distance standards. With symmetrically sized, regularly repeating interdigitated mesa patterns, the lateral repeat pattern distance 102H can be designed to provide the lateral size calibration standard. This lateral repeat pattern distance 102H can then be calibrated using known calibrated instruments. Once the trench 90 etch is accomplished, then a step-flow growth process is performed to eliminate steps on the mesa 92 and 94 in order to produce atomically-flat mesa tops 92 and 94.

Figure 9B:
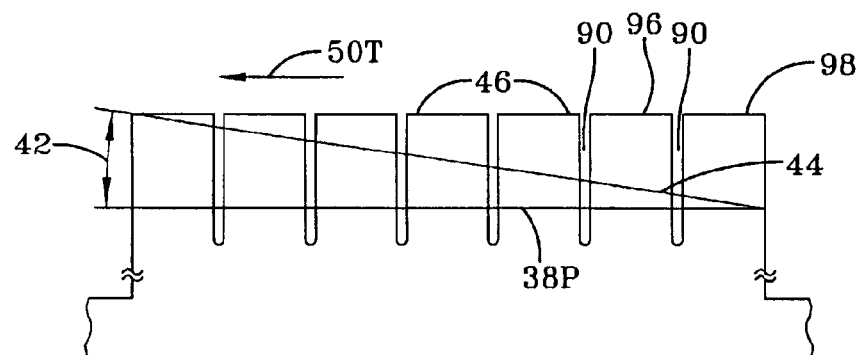
Figure 9C:
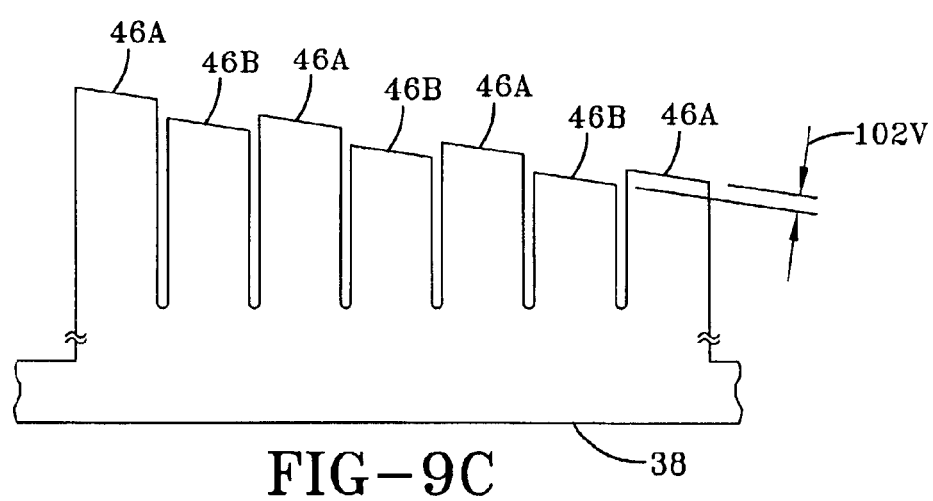

FIGS. 9B and 9C illustrate schematically cross-sectional views 9A–9A' of the two interdigitated mesas (92 and 94) before and after step-flow growth respectively. The trench 90 separates the two mesas. In FIG. 9B, before step-flow growth, the initial surface 46 is tilted by an angle 42 relative to the basal plane 44; the line 38P is parallel to the initial surface 46 and the bottom 38 of the wafer. Hence, the initial surface 46 is tilted by an angle 42 in the direction 50T. The growth of atomically-flat surfaces on mesas 92 and 94 initiates at the top most bilayer on the mesas which is at position 96 for mesa 92 and at position 98 for mesa 94.

FIG. 9C illustrates the surfaces after atomically-flat surfaces have been grown on mesas 92 and 94. Because of the upstep offset 100 between the two mesas, the two atomically-flat surfaces 46A and 46B will be offset vertically by an amount 102V. Hence, a measurement along the line 9A–9A' by a profilometer produces a square wave configuration (not including the effect of the slight tilt of the surface with respect to the wafer bottom 38 and the narrow trench 90 between the two mesas).

The nominal result of the crystallographically controlled formation of FIG. 9 is that adjacent step-free mesas with atomically-flat top surfaces are provided that exhibit a constant relative height difference which is directly related to the offset distance 100 shown in FIG. 9. This height difference can then be calibrated using known calibrated instruments.

For all embodiments of the present invention, it is desired to take into account different growth conditions, which lead to different amounts (i.e., rates) of two-dimensional (2D) island nucleation during epitaxial growth. The details for controlling these different growth conditions are described with reference to FIG. 13 in the previously incorporated by reference U.S. patent application Ser. No. 09/965,250 now U.S. Pat. No. 6,488,771 issued Dec. 3, 2002.

It should now be appreciated that the practice of the present invention provides for different embodiments all of which yield structures and techniques for fabrication of ordered arrangement of atomic scale steps on a single-crystal device, preferably formed of a SiC polytype. The structures provided by the present invention consist of patterned arrays of mesas that are etched or grown on a selected crystal plane. The produced structures may be used as artifacts in scanning probe microscopes and profilometers for step-height calibration ranging from less than 1 nanometer to greater than 10 nanometers with essentially no atomic scale roughness on the plateau on either side of any of the produced steps. In some embodiments, the lateral dimensions defining the distance between steps allow the standardization artifacts to be calibrated on the order of micrometers laterally.

Recent advances in the heteroepitaxial growth of defect free (or nearly defect free) 3C-SiC films on atomically-flat surfaces of hexagonal polytypes of SiC form the basis for the application of the newly discovered etching behavior of 3C-SiC to be incorporated in an embodiment of this invention and illustrated in FIG. 10. The prior art is more fully described in U.S. Pat. Nos. 5,195,194, 6,165,874, and U.S. patent application Ser. No. 09/965,250 now U.S. Pat. No. 6,488,771 issued Dec. 3, 2002. The 3C-SiC growth was also reported in a paper entitled "Growth of Defect Free 3C-SiC on 4H and 6H-SiC Mesas Using Step-Free Surface Heteroepitaxy" at the International Conference on Silicon Carbide and Related Materials 2001 (ICSCRM 2001) in October, 2001, and published in Materials Science Forum Vols. 389–393, pp 311–314, Trans Tech Publications. (2002).

Figure 10A:
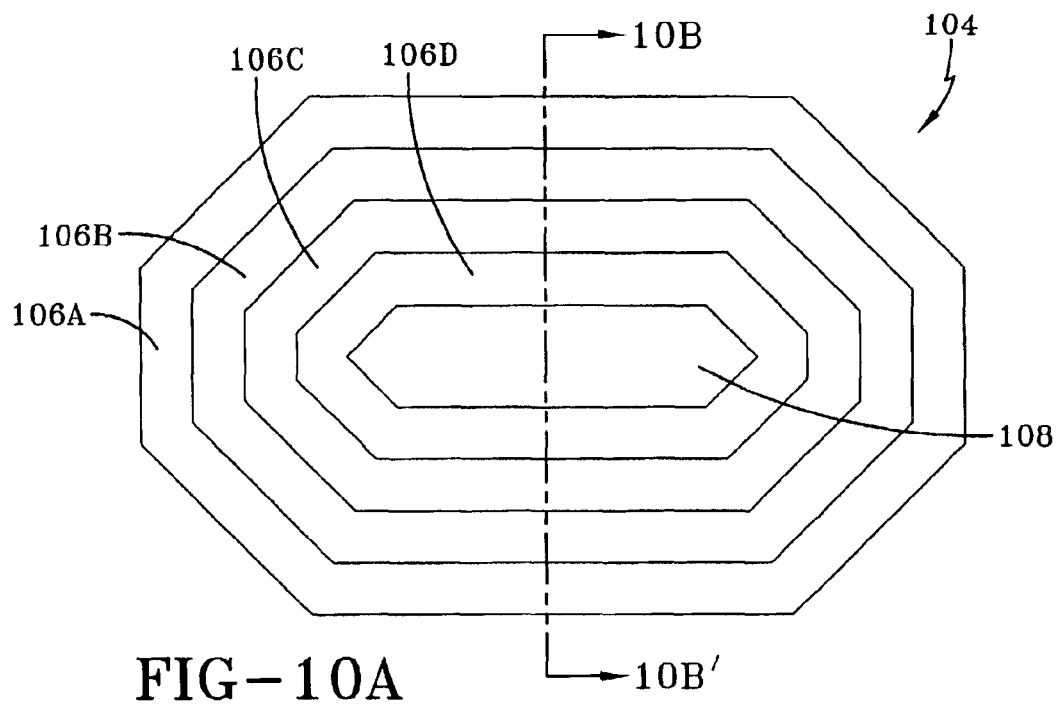
FIG. 10A is a top view of the plateaus.
Figure 10B:
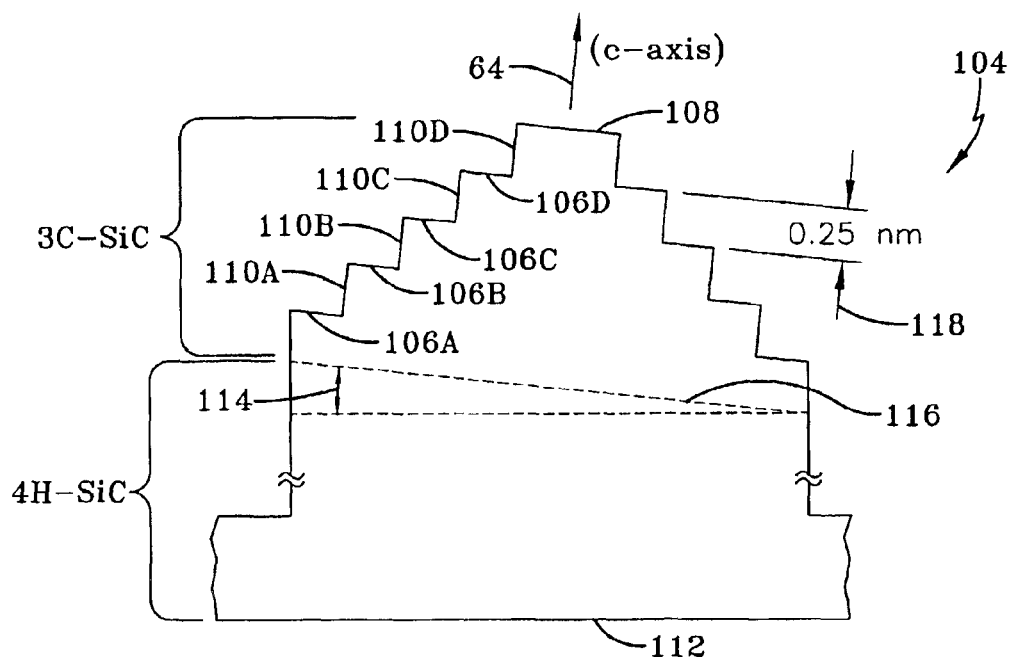
FIG. 10B is a cross-sectional view showing the single-bilayer steps and the tilt of the plateaus with respect to the bottom of the wafer. For purposes of illustration, it is assumed that the initial top surface of the wafer is parallel to the bottom surface of the wafer.

This embodiment of the present invention may be described with reference to FIG. 10 illustrating a single-crystal mesa 104 comprised of a 3C-SiC film deposited over atomically-flat 4H-SiC mesa surface. FIG. 10 illustrates a plurality of plateaus 106A, 106B, 106C and 106D and an uppermost top surface 108 following a step-flow etch. FIG. 10A is a top view of the plateaus 106A, 106B, 106C, and 106D, and uppermost surface 108, and FIG. 10B is a cross-sectional view taken along line 10B–10B' of FIG. 10A showing the single-bilayer steps 110A, 110B, 110C, and 110D and the tilt of the plateaus with respect to the bottom 112 of the wafer. As seen in FIG. 10B, the plateaus 106A, 106B, 106C and 106D, are relative to a tilt angle 114 which, in turn, is measured relative to the bottom 112 and the 3C/4H interface shown by dimensional line 116.

The SiC single-crystal is treated by a step-flow etch that is carried out on the 3C-SiC single crystal heteroepitaxial film that has been grown on an atomically flat 4H-SiC mesa 104 using the process described in U.S. patent application Ser. No. 09/965,250, now U.S. Pat. No. 6,488,771 issued Dec. 3, 2002. The step-flow etch produces a pyramidal pattern of concentric plateaus 106A, 106B, 106C, and 106D have a step-height 118 of a single bilayer (approximately 0.25 nm) between each plateau. The shape of the plateaus 1060.0A, 106B, 106C and 106D approximate the shape of the mesa 104.

The benefits of the embodiment of FIG. 10 are based on the recent discovery by the inventors that revealed that step-flow etching of a (111) 3C-SiC surface (or a 3C-SiC surface nearly parallel to the (111) 3C-SiC crystallographic plane) produces steps, such as 110A, 110B, 110C and 110D that are only one bilayer in height 118. Based on the behavior of other SiC polytypes, one skilled in the art might expect that step-flow etching might produce steps that are 3 bilayers in height. The (111) crystallographic plane of 3C-SiC (a cubic crystalline structure) is equivalent to the basal (0001) plane of hexagonal or rhombohedral SiC polytypes. As pointed out hereinbefore, a step-flow etch of a vicinal (0001) surface of hexagonal or rhombohedral SiC produces steps that have a height of the c-axis repeat distance of the particular SiC polytype, which is different than the embodiment of FIG. 10. In addition, it was recently discovered that if the step-flow etching takes place on the top surface of a small mesa, a pyramidal pattern of concentric plateaus, such as that shown in FIG. 10, is created with a step-height of one bilayer between successive plateaus. This 3C-SiC behavior is also different from the other SiC polytypes as the other SiC polytypes yield a pattern of inter-leaved plateaus instead of concentric plateaus. Finally, the shape of the concentric plateaus of the embodiment of FIG. 10 approximates the outside edge of the top mesa surface. Hence, it is possible to produce a well ordered pyramidal pattern of concentric single bilayer steps on a mesa whose top surface is 3C-SiC.

A specific example of the embodiment of FIG. 10 is the following. Using prior art processes, defect-free 3C-SiC films were grown heteroepitaxially on an array of 4H-SiC mesas 104. Some mesas 104 had the shape of an elongated octagon with the longest straight edge length of approximately 50 micrometers. These mesas were etched in hydrogen with a few percent of propane present at a temperature of 1650° C. for about 15 minutes. The pyramidal pattern of steps, shown schematically in FIG. 10, was produced.

The invention has been described with reference to preferred embodiments and alternates thereof. It is believed that many modifications and alterations to the embodiments as discussed herein will readily suggest themselves to those skilled in the art upon reading and understanding the detailed description of the invention. It is intended to include all such modifications and alterations insofar as they come within the scope of the present invention.

What we claim is:

1. A method to produce a product comprising a single-crystal device having a plurality of mesas and said product being a diagnostic sample with nanometer scale steps for the purpose of producing a step-height calibration physical artifact used for instruments selected from the group consisting of scanning probe microscopes, profilometers, and physical measurement devices, said method comprising the operational steps of:

(a) selecting a single-crystal substrate from the group consisting of the hexagonal and rhombohedral polytypes of SiC;

(b) preparing a planar first surface on said single-crystal substrate wherein said planar first surface is tilted by an angle of less than ten (10) degrees, but greater than zero (0) degrees with respect to the crystal basal plane;

(c) removing material from said planar first surface so as to define a plurality of mesas with separated top second surfaces with characteristics of said top second surfaces selected from the group consisting of area, shape, and crystal orientation; and (d) providing crystallographically controlled formation of steps on said top second surfaces of said mesas by a process selected from the group consisting of (1) a step-flow etc, (2) a step-flow growth, and (3) a step-flow etch and a step-flow growth.

2. The method according to claim 1, wherein said planar first surface is tilted by an angle of less than two (2) degrees.

3. The method according to claim 1, wherein said single-crystal substrate is selected from the group consisting of 4H-SiC and 6H-SiC.

4. The method according to claim 1, wherein direction of said tilt is within 5 degrees of a selected <1$\bar{1}$00> crystallographic direction.

5. The method according to claim 1, wherein direction of said tilt is within 5 degrees of a selected <11$\bar{2}$0> crystallographic direction.

6. The method according to claim 4, wherein said tilt angle is approximately 0.1 degree.

7. The method according to claim 5, wherein said tilt angle is approximately 0.1 degree.

8. A method for producing structural steps on a single-crystal device with a crystal basal plane and having a plurality of mesas, said method comprising the operational steps of:

(a) selecting a single-crystal substrate from the group consisting of the hexagonal and rhombohedral polytypes of SiC;

(b) preparing a planar first surface on said single-crystal substrate wherein said planar first surface is tilted by an angle of less than ten (10) degrees, but greater than zero (0) degrees with respect to the crystal basal plane; wherein said planar first surface is intersected by extended crystalloraphic defects having an average density and wherein said top second surface of mesas has a selected area that is less than twice the inverse of said average density of extended crystallographic defects that intersect the said planar first surface;

c) removing material from said planar first surface so as to define a plurality of mesas with separated top second surfaces with characteristics of said top second surfaces selected from the group consisting of area, shape, and crystal orientation; and (d) providing crystallographically controlled formation of steps on said top second surfaces of said mesas by a process selected from the group consisting of (1) a step-flow etch, (2) a step-flow growth, and (3) a step-flow etch and a step-flow growth.

9. The method according to claim 4, wherein said selected shape of said top second surface of mesas is selected from the group consisting of squares, rectangles, hexagons, and polygons.

10. The method according to claim 9, wherein said selected shape of said second top surface is such that at least one straight edge of said top second surface is parallel to within 5 degrees of the said selected <1$\bar{1}$00> crystallographic direction.

11. The method according to claim 5, wherein said selected shape of said top second surface of mesas is selected from the group consisting of squares, rectangles, hexagons, and polygons.

12. The method according to claim 11, wherein said selected shape of said second top surface is such that at least one straight edge of said top second surface is parallel to within 5 degrees of the said selected <11$\bar{2}$0> crystallographic direction.

13. The method according to claim 9, wherein said selected shape of said second top surface is so as to be rectangular wherein the long side of said rectangular top second surface of mesas is parallel to within 5 degrees of the said selected <1$\bar{1}$00> crystallographic direction.

14. The method according to claim 11, wherein said selected shape of said second top surface is such so as to be rectangular wherein the long side of said rectangular top second surface of mesas is parallel to within 5 degrees of the said selected <11$\bar{2}$0> crystallographic direction.

15. The method according to claim 1, wherein said step-flow etch of said operational step (d) is provided by a gaseous step-flow etch wherein a step-flow etch is carried out in a growth/etching system at a temperature greater than 1000° C., but less than 2000° C. in a vapor selected from the group of vapors consisting of (1) hydrogen, (2) hydrogen plus hydrogen chloride, (3) and a mix of hydrogen with other gases selected from the group consisting of hydrocarbons, inert gases, and oxygen.

16. The method according to claim 1, wherein said step-flow etch or step-flow growth of said operational step (d) is provided by a sublimation step-flow process wherein said step-flow process is carried out in a growth/etching system at a temperature greater than 1800° C., but less than 2500° C.

17. The method according to claim 1, wherein said step-flow growth of said operational step (d) is provided by the further steps consisting of:

(di) treating said substrate so as to remove any removable sources of unwanted crystal nucleation and any removable sources of steps; and (dii) depositing a homoepitaxial film on said second top surface of mesas under step-flow growth conditions so as to produce a top third surface on said mesas with the desired structural steps.

18. The method according to claim 1, wherein said step-flow etch and step-flow growth of said operational step (d) are each provided by the further steps consisting of:

(di) (treating said substrate so as to remove any removable sources of unwanted crystal nucleation and any removable sources of steps;

(dii) etching said top second surface of mesas under step-flow etching conditions in a growth/etching system at a temperature greater than 1000° C., but less than 2000° C. in vapor selected from the group of vapors consisting of (1) hydrogen, (2) hydrogen plus hydrogen chloride, (3) and a mix of hydrogen with other gases such as hydrocarbons, inert gases, and oxygen so as to produce an array of structural steps on said top second surface of said mesas; and (diii) depositing a homoepitaxial film on said second top surface of mesas under step-flow growth conditions so as to produce a top third surface of said mesas with the desired structural steps.

19. The method according to claim 1, wherein said operational step (c) includes removing additional material from said first surface so as to produce an identifying marker for each mesa so that each mesa can be located on the single-crystal device.

20. The method according to claim 1, wherein said selected single crystal substrate is doped to provide a desired electrical conductivity.

21. A method for producing structural steps on a single-crystal device with a crystal basal plane and having a plurality of mesas, said method comprising the operational steps of:
(a) selecting a single-crystal substrate from the group consisting of the hexagonal and rhombohedral polytypes of SiC;
(b) preparing a planar first surface on said single-crystal substrate wherein said planar first surface is tilted by an angle of less than ten (10) degrees, but greater than zero (0) degrees with respect to the crystal basal plane;
(c) removing material from said planar first surface so as to define a plurality of mesas with separated top second surfaces with characteristics of said top second surfaces selected from the group consisting of area, shape, and crystal orientation; and
(d) treating said top second surfaces of said mesas so as to remove any removable sources of unwanted crystal nucleation and any removable sources of steps from said top second surfaces;
(e) depositing homoepitaxial film over said top second surface of said mesa of said single-crystal device under selected conditions so as to provide a step-flow growth while suppressing two-dimensional nucleation;
(f) continuing said deposition of said homoepitaxial film until said step-flow growth obtains an atomically-flat epitaxial film surface on said top second surfaces of said mesa of said single-crystal device; and
(g) providing a step-flow etch of said atomically-flat said top second surfaces so as to provide plateaus having sequentially increasing heights and forming structural steps.

22. A method to produce a product comprising a single-crystal device having a plurality of mesas and said product is a diagnostic sample with nanometer scale steps for the purpose of producing a step-height calibration physical artifact for instruments selected from the group consisting of scanning probe microscopes, profilometers, and physical measurement devices, said method comprising the operational steps of:
(a) selecting a single-crystal substrate from the group consisting of hexagonal and rhombohedral polytypes of silicon carbide;
(b) preparing a planar first surface on said single-crystal substrate wherein said planar first surface is tilted by an angle of less than ten (10) degrees, but greater than zero (0) degrees with respect to the crystal basal plane;
(c) removing material from said planar first surface so as to define a plurality of mesas with separated top second surfaces with characteristics of said top second surface selected from the group consisting of area, shape, and crystal orientation;
(d) treating said top second surfaces of said mesas so as to remove any removable sources of unwanted crystal nucleation and any removable sources of steps from said top second surfaces;
(e) providing a step-flow etch of said atomically-flat said top second surfaces so as to provide plateaus having sequentially increasing heights and forming structural steps.

23. The method according to claim 21, wherein said single-crystal substrate is selected from the group consisting of 4H-SiC and 6H-SiC.

24. The method according to claim 21, wherein said tilt angle is less than 1 degree.

25. The method according to claim 21, wherein said tilt angle is less than 0.1 degree.

26. The method according to claim 21, wherein said planar first surface is intersected by extended crystallographic defects having an average density and wherein each of said top second surfaces has an area that is less than twice the inverse of the average density of extended crystallographic defects that intersect the said planar first surface.

27. The method according to claim 21, wherein said selected shape of said top second surface of mesas is selected from the group consisting of squares, rectangles, hexagons, and polygons.

28. The method according to claim 27, wherein the direction of said tilt is within 5 degrees of a selected $<1\bar{1}00>$ crystallographic direction, and wherein said selected second top surface is such that at least one straight edge of said top second surface is parallel to within 5 degrees of said selected $<1\bar{1}00>$ crystallographic direction.

29. The method according to claim 27, wherein the direction of said tilt is within 5 degree of a selected $<11\bar{2}0>$ crystallographic direction, and wherein said selected second top surface is such that at least one straight edge of said top second surface is parallel to within 5 degrees of said selected $<11\bar{2}0>$ crystallographic direction.

30. The method according to claim 21, wherein said step-flow etch of said operational step (g) is carried out in a growth/etching system at a temperature greater than 1000° C., but less than 2000° C. in a vapor selected from the group of vapors consisting of hydrogen, hydrogen plus hydrogen chloride, and a mix of hydrogen with gases selected from the group consisting of hydrocarbons, inert gases, and oxygen.

31. The method of claim 21, wherein the direction of said tilt is within 5 degrees of a selected $<11\bar{2}0>$ crystallographic direction, and wherein said selected shape of said top second surface of said mesas is rectangular having two sides that are parallel to within 5 degrees to the said selected $<11\bar{2}0>$ crystallographic direction so as to yield two sets of U-shaped plateaus that are interleaved in a manner that produces two sets of structural steps each having step risers and repeat height and a step-height, wherein one set of said step risers is approximately parallel to said selected $<11\bar{2}0>$ crystallographic direction with step-heights equal to the unit repeat height of the selected crystal polytype of silicon carbide, and the other set of step risers is approximately perpendicular to said selected $<11\bar{2}0>$ crystallographic direction with step-heights equal to half the unit repeat height of the selected crystal polytype of silicon carbide.

32. The method of claim 31, wherein length-to-width aspect of said rectangular-shaped top surface is selected so that the length of said structural steps of a unit repeat height is greater than the length of said structural steps having a half-unit repeat height.

33. The method of claim 31, wherein length-to-width aspect ratio of said rectangular shaped top surface is selected so that the length of said structural steps of a half-unit repeat height is greater than the length of said structural steps having a unit repeat height.

34. The method of claim 31, wherein the said single-crystal substrate is 4H-sic.

35. The method of claim 31, wherein the said single-crystal substrate is 6H-sic.

36. The method according to claim 21 wherein said operational step (c) includes removing additional material from said first surface so as to produce an identifying marker for each mesa so that each mesa can be located on the single-crystal device.

37. The method according to claim 21, wherein said selected single crystal substrate is doped to provide a desired electrical conductivity.

38. A method for producing structural steps on a single-crystal device with a crystal basal plane and having a plurality of mesas, said method comprising the operational steps of:
(a) selecting a single-crystal substrate from the group consisting of the hexagonal and rhombohedral polytypes of silicon carbide and with each polytype having a unit height;
(b) preparing a planar first surface on said single-crystal substrate wherein said planar first surface is tilted by a predetermined angle toward a predetermined crystallographic tilt direction;
(c) etching said top planar first surface under selected step-flow etch conditions so as to remove any removable sources of steps and any unwanted crystal nucleation and produce a modified top planar first surface with some structural steps with a step-height equal to the unit height of said polytype and with an average step-to-step separation distance d;
(d) removing material from said modified top planar first surface to produce (1) at least one separated top second surface with a first length in the said predetermined crystal tilt direction whereby said first length is more than six times said average step-to-step separation distance d, (2) a plurality of separated top third surfaces which are adjacent to one another along a line in said predetermined crystal tilt direction and whereby said top third surfaces have a second length in said predetermined crystal tilt direction whereby said second length is less than half said first length of said separated top second surface and more than twice said average step-to-step separation distance d, and (3) said top third surfaces have a width w greater than a predetermined minimum value wherein said width w is measured perpendicular to the predetermined crystallographic tilt direction;
(e) depositing homoepitaxial film over said top second surfaces and over said top third surfaces of said single-crystal device under selected conditions so as to provide a step-flow growth while suppressing two-dimensional nucleation;
(f) continuing said deposition of said homoepitaxial film for a predetermined duration so that said step-flow growth obtains an atomically-flat epitaxial film surface on said top third surfaces but not of a sufficient duration to eliminate all steps from said top second surfaces so as to produce vertical displacements between adjacent said top third surfaces that are a multiple of the unit height of the polytype of said silicon carbide and whereby said vertical displacements increase as the ratio of said second length of said top third surfaces to said average step-to-step separation distance d increases.

39. The method according to claim 38, wherein said operational steps (a)–(f) produce a product comprising a single-crystal having a plurality of mesas and said product is a diagnostic sample with nanometer scale steps for the purpose of producing a step-height calibration physical artifact for instruments selected from the group consisting of scanning probe microscopes, profilometers, and physical measurement devices.

40. The method according to claim 38, wherein said single-crystal substrate is selected from the group consisting of 4H-SiC and 6H-SiC.

41. The method according to claim 38, wherein said direction of said tilt is within 5 degrees of a <1$\bar{1}$00> crystallographic direction.

42. The method according to claim 38, wherein said direction of said tilt is within 5 degrees of a <11$\bar{2}$0> crystallographic direction.

43. The method according to claim 41, wherein said tilt angle is approximately 0.1 degree.

44. The method according to claim 42, wherein said tilt angle is approximately 0.1 degree.

45. The method according to claim 38, wherein said step-flow etch of said operational step (c) is carried out in a growth/etching system at a temperature greater than 1000° C., but less than 2000° C. in a vapor selected from the group of vapors consisting of (1) hydrogen, (2) hydrogen plus hydrogen chloride, (3) and a mix of hydrogen with other gases selected from the group consisting of hydrocarbons, inert gases, and oxygen.

46. The method according to claim 38, wherein said separated top second surface has a strip-like surface oriented parallel to within 5 degrees of the said predetermined crystallographic tilt direction.

47. The method according to claim 38, wherein said top third surfaces comprise a sequence of adjacent rectangles that are lined up along said predetermined crystallographic tilt direction.

48. The method according to claim 38, wherein said separated top second surface has a strip-like surface oriented parallel to within 5 degrees of said predetermined crystallographic tilt direction and wherein said separated top second surface is arranged side-by-side with said top third surfaces comprising a sequence of adjacent rectangles that are lined up along said predetermined crystallographic tilt direction.

49. The method according to claim 38, wherein each said top second surface has a nearby set of top third surfaces and wherein said operational step (d) includes removing additional material from said first surface so as to produce an identifying marker for each said separated top second surface so that each said top second surface and said nearby set of top third surfaces can be located on the single-crystal device.

50. The method according to claim 38, wherein said planar first surface is intersected by extended crystallographic defects having an average density and wherein each of said separated top third surfaces has an average area that is less than twice the inverse of the average density of extended crystallographic defects that intersect the said planar first surface.

51. The method according to claim 38, wherein said separated top second surface has a width and wherein said width w of both said separated top second surfaces and said separated third surfaces is greater than 1 micrometer, but less than 1000 micrometers.

52. The method according to claim 38, wherein said selected single crystal substrate is doped to provide a desired electrical conductivity.

53. A method for producing structural steps on a single-crystal device with a basal plane and having a plurality of mesas, said method comprising the operational steps of:
(a) selecting a single-crystal substrate from the group consisting of hexagonal and rhombohedral polytypes of silicon carbide and with each polytype having a unit height;
(b) preparing a planar first surface on said single-crystal substrate wherein said planar first surface is tilted by a predetermined angle and tilted in a predetermined crystallographic direction;

(c) removing material from said planar first surface so as to define a plurality of pairs of adjacent but separated mesas wherein each of said pairs has an upstep direction and wherein one mesa top surface from each pair is designated as the top second surface and the other mesa top surface from each of said pairs is designated as the top third surface and wherein said top second surface extends slightly further in the upstep direction than said top third surface for each pair by a fixed amount to produce a vertical displacement therebetween;

(d) treating said top second surfaces and said top third surfaces of said pairs of mesas so as to remove any removable sources of unwanted crystal nucleation and any removable sources of steps from said top second surfaces and from said top third surfaces;

(e) depositing homoepitaxial film over said top second surfaces and said top third surfaces of said mesa pairs of said single crystal device under selected conditions so as to provide a step-flow growth while suppressing two-dimensional nucleation; and (f) continuing said deposition of said homoepitaxial film until said step-flow growth obtains an atomically-flat epitaxial film surface on said top second surfaces and said top third surfaces so as to produce said pairs of mesas with each mesa pair containing a step-free top second surface and a step-free top third surface that are displaced vertically by said fixed amount relative to each other.

54. The method according to claim 53, wherein the vertical displacement is calibrated so as to produce a product comprising a diagnostic sample with nanometer scale steps for the purpose of producing a step-height calibration artifact for instruments selected from the group consisting of scanning probe microscopes, profilometers, and physical measurement devices.

55. The method according to claim 53, wherein said operational step (c) includes removing additional material from said first surface so as to produce an identifying marker for each said pair of mesas so that each said pair of mesas can be located on the single-crystal device.

56. The method of according to claim 53, wherein each of said pairs of said top second surfaces and said top third surfaces form an interdigitated pattern with respect to each other.

57. The method of according to claim 56, wherein said interdigitated pattern is comprised of elongated interdigitated fingers.

58. The method of according to claim 57, wherein said elongated interdigitated fingers are aligned perpendicular to said predetermined crystallographic tilt direction.

59. The method according to claim 53, wherein said fixed amount of each of said pairs is selected to be different for different pairs of top second surfaces and top third surfaces so as to provide a desired range of said vertical displacements on the said single-crystal device.

60. The method according to claim 53, wherein said single-crystal substrate is selected from the group consisting of 4H-SiC and 6H-SiC.

61. The method according to claim 53, wherein said direction of said tilt is within 5 degrees of a <1$\bar{1}$00> crystallographic direction.

62. The method according to claim 53, wherein said direction of said tilt is within 5 degrees of a <11$\bar{2}$0> crystallographic direction.

63. The method according to claim 61, wherein said tilt angle is approximately 0.1 degree.

64. The method according to claim 63, wherein said tilt angle is approximately 0.1 degree.

65. The method according to claim 53, wherein said planar first surface is intersected by extended crystallographic defects having an average density wherein each of said adjacent, but separated mesas is selected to have an area that is less than twice the inverse of the average density of extended crystallographic defects that intersect the said planar first surface.

66. The method according to claim 53, wherein said selected single crystal substrate is doped to provide a desired electrical conductivity.

67. A method for producing structural steps on a single-crystal device with a basal plane including a (111) crystallographic plane and having a plurality of mesas each having a top surface, said method comprising the operational steps of:

(a) preparing a plurality of mesa structures on a substrate wherein the material of the top surface of each mesa is single crystal 3C-SiC with said top surface that is (1) planar and parallel within 0.1 degrees of the (111) crystallographic plane and (2) has characteristics selected from the group consisting of selected area, selected shape, and selected crystallographic orientation; and (b) providing a step-flow etch of said top surfaces of said 3C-SiC so as to provide concentric plateaus on each of said mesas and each with a center thereof and wherein said plateaus have sequentially increasing heights toward the center of said concentric plateaus and forming said structural steps with a height of a single bilayer of 3C-SiC between each of said concentric plateaus.

68. The method according to claim 67, wherein said operational steps (a) and (b) produce a product having a plurality of mesas and said product is a diagnostic sample with nanoscale steps for the purpose of providing a step-height calibration physical artifact for use with instruments selected from the group consisting of scanning probe microscopes, profilometers, and physical measurement devices.

69. The method according to claim 67, wherein said operational step (a) is accomplished by the operational steps of:

(ai) selecting a single-crystal substrate from the group consisting of the hexagonal and rhombohedral polytypes of SiC;

(aii) preparing a planar first surface on said single-crystal substrate wherein said planar first surface is tilted by an angle of less than ten (10) degrees, but greater than zero (0) degrees with respect to the crystal basal plane;

(aiii) removing material from said planar first surface so as to define a plurality of mesas with separated top second surfaces and with characteristics of said top second surface selected from the group consisting of area, shape, and crystal orientation;

(aiv) treating said separated top second surfaces of said mesas so as to remove any removable sources of unwanted crystal nucleation and any removable sources of steps from said separated top second surfaces;

(av) depositing a homoepitaxial film over said separated top second surfaces of said mesas of said single-crystal device under selected conditions so as to provide step-flow growth while suppressing two-dimensional nucleation;

(avi) continuing said deposition of said film until said step-flow growth obtains an atomically-flat epitaxial film surface on said separated top second surfaces of said single-crystal device; and (avii) carrying out a heteroepitaxial growth of 3C-SiC on said atomically-flat epitaxial film surface on said separated top second surfaces of step (avi) so as to produce a substantially defect-free single-crystal film of said 3C-SiC.

70. The method according to claim 67, wherein said top surface is intersected by extended crystallographic defects having an average density and wherein said selected area of each of said top surfaces of mesas has a characteristic that is less than twice the inverse of the average density of extended crystallographic defects in said substrate.

71. The method according to claim 67, wherein selected shape of said top surfaces of mesas is selected from the group consisting of squares, rectangles, hexagons, and other polygons.

72. The method according to claim 71, wherein selected shape of said top surfaces is rectangular.

73. The method according to claim 67, wherein said step-flow etch of step (b) is carried out in a growth/etching system at a temperature greater than 1000° C., but less than 2000° C. in a vapor selected from the group of vapors consisting of hydrogen, hydrogen plus hydrogen chloride, or a mix of hydrogen with other gases such as hydrocarbons, inert gases, and oxygen.

74. The method according to claim 67, wherein said operational step (a) of preparing a plurality of mesa structures on a substrate includes removing additional material from said substrate so as to produce an identifying marker for each mesa so that each mesa can be located on the single-crystal device for later calibration and other purposes.

75. The method according to claim 67, wherein said selected single crystal substrate is doped to provide a desired electrical conductivity.

* * * * *